United States Patent
Kosydar et al.

(10) Patent No.: US 9,359,517 B2
(45) Date of Patent: Jun. 7, 2016

(54) NON-AQUEOUS COMPOSITIONS OF DISPERSED CARBON-COATED METAL PARTICLES

(71) Applicants: Karen M. Kosydar, Penfield, NY (US); Gary L. Slater, Rochester, NY (US); Mary Christine Brick, Webster, NY (US); Christine Joanne Landry-Coltrain, Fairport, NY (US); James Albert Reczek, Rochester, NY (US)

(72) Inventors: Karen M. Kosydar, Penfield, NY (US); Gary L. Slater, Rochester, NY (US); Mary Christine Brick, Webster, NY (US); Christine Joanne Landry-Coltrain, Fairport, NY (US); James Albert Reczek, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/514,463

(22) Filed: Oct. 15, 2014

(65) Prior Publication Data

US 2016/0108266 A1    Apr. 21, 2016

(51) Int. Cl.
| | |
|---|---|
| *C08F 2/46* | (2006.01) |
| *C08F 2/50* | (2006.01) |
| *C08G 61/04* | (2006.01) |
| *C09D 11/38* | (2014.01) |
| *C09D 179/08* | (2006.01) |
| *C09D 179/02* | (2006.01) |
| *C09D 179/04* | (2006.01) |
| *C09D 133/14* | (2006.01) |

(52) U.S. Cl.
CPC ............ *C09D 11/38* (2013.01); *C09D 133/14* (2013.01); *C09D 179/02* (2013.01); *C09D 179/04* (2013.01); *C09D 179/08* (2013.01)

(58) Field of Classification Search
USPC ................ 522/8, 7, 6, 1, 189, 184, 71; 520/1
See application file for complete search history.

(56) References Cited

U.S. PATENT DOCUMENTS

| | | | |
|---|---|---|---|
| 8,268,957 B2 | 9/2012 | Liu et al. | |
| 8,506,849 B2 | 8/2013 | Li et al. | |
| 8,597,420 B2 | 12/2013 | Iftime et al. | |
| 2007/0202437 A1* | 8/2007 | Ishibashi | ................ G03F 7/038 430/270.1 |
| 2008/0090082 A1 | 4/2008 | Shim et al. | |
| 2012/0235079 A1 | 9/2012 | Iftime et al. | |
| 2012/0236064 A1* | 9/2012 | Iftime | .................... C09D 11/36 347/20 |
| 2014/0295063 A1 | 10/2014 | Petcavich et al. | |
| 2015/0024141 A1* | 1/2015 | Shukla | ....................... C08J 3/28 427/510 |

FOREIGN PATENT DOCUMENTS

WO    2014/070131    5/2014

* cited by examiner

*Primary Examiner* — Ling Choi
*Assistant Examiner* — Jessica E Whiteley
(74) *Attorney, Agent, or Firm* — J. Lanny Tucker

(57) ABSTRACT

A non-aqueous composition contains dispersed carbon-coated metal particles in an organic diluent in an amount of at least 10 weight %. The dispersed carbon-coated metal particles have a median diameter equal to or less than 0.6 μm, and are dispersed using a particle dispersing agent that has a weight average molecular weight ($M_w$) of at least 2,000 and up to and including 100,000 and comprises nitrogen-containing units. The median diameter of the dispersed particles is determined using a dynamic light scattering method. Moreover, when the non-aqueous composition contains up to and including 25 weight % of the dispersed carbon-coated metal particles, it exhibits no visual settling when subjected to a settling test of at least 24 hours at 20° C. Such non-aqueous compositions can include photocurable components and are useful to prepare photocurable and photocured electrically-conductive patterns and layers in various articles, including touch screen devices having touch screen displays.

20 Claims, No Drawings

NON-AQUEOUS COMPOSITIONS OF DISPERSED CARBON-COATED METAL PARTICLES

RELATED APPLICATIONS

Reference is made to the following copending and commonly assigned patent applications, the disclosures of which are incorporated herein by reference:

U.S. Ser. No. 14/514,492, filed on Oct. 15, 2014, by Kosydar, Slater, Brick, and Landry-Coltrain and entitled "Photocurable Compositions with Dispersed Carbon-Coated Metal Particles;"

U.S. Ser. No. 14/514,500, filed on Oct. 15, 2014, by Kosydar, Brick, Landry-Coltrain, and Slater and entitled "Articles Containing Carbon-Coated Metal Particles;" and U.S. Ser. No. 14/514,514, filed on Oct. 15, 2014, by Kosydar, Landry-Coltrain, Slater, and Brick and entitled "Forming Articles and Devices with Carbon-Coated Metal Particles.

FIELD OF THE INVENTION

This invention relates to non-aqueous compositions containing dispersed carbon-coated metal particles and uniquely chosen particle dispersing agents. This invention also relates to non-aqueous photocurable compositions containing such dispersed carbon-coated metal particles and particle dispersing agents. Such non-aqueous photocurable compositions can be used to provide seed metal catalysts for electroless plating methods that are designed to provide patterns of electrically-conductive materials.

BACKGROUND OF THE INVENTION

Rapid advances are occurring in various electronic devices, especially display devices that are used for various communicational, financial, and archival purposes. For such uses as touch screen panels, electrochromic devices, light emitting diodes, field effect transistors, and liquid crystal displays, conductive films are essential and considerable efforts are being made in the industry to improve the properties of those conductive films.

There is a particular need to provide touch screen displays and devices that contain improved conductive film elements. Currently, touch screen displays use Indium Tin Oxide (ITO) coatings to create arrays of capacitive areas used to distinguish multiple point contacts. ITO coatings have significant short comings. Indium is an expensive rare earth metal and is available in limited supply from very few sources in the world. ITO conductivity is relatively low and requires short line lengths to achieve adequate response rates. Touch screens for large displays are broken up into smaller segments to reduce the conductive line length to an acceptable resistance. These smaller segments require additional driving and sensing electronics. In addition ITO is a ceramic material, is not readily bent or flexed, and requires vacuum deposition with high processing temperatures to prepare the conductive layers.

Silver is an ideal conductor having conductivity 50 to 100 times greater than ITO. Silver is used in many commercial applications and is available from numerous sources. It is highly desirable to make conductive film elements using silver as the source of conductivity, but it requires considerable development to obtain the optimal properties.

The production of touch screen sensors and other transparent conductive articles in roll-to-roll production methods on flexible and transparent substrates using "additive processes" for deposition of electrically-conductive patterns that provide the functionality of the sensor has been the subject of recent development in the industry. Of particular importance is the ability to produce a touch screen sensor that has both the desired electrical performance as well as appropriate optical properties (transmittance) in the visible portion (touch region) of the touch screen sensor. To achieve the necessary conductive and optical properties, average line widths of electrically-conductive lines in the electrically-conductive grid of less than 10 μm are greatly desired.

The flexible and transparent substrates used in such processes should be optically clear (high integrated transmittance) and colorless and exhibit low haze. The application of electrically-conductive patterns using additive processes such as flexographic printing of electrically-conductive materials or seed metal compositions requires the flexible and transparent substrate to have appropriate surface energy and roughness consistent with the scale of the fine features (for example, fine lines) to be applied. Considerable effort is being exerted in the electronics industry to achieve these necessary features.

WO 2013/063188 (Petcavich et al.) describes a method for producing a mutual capacitance touch sensor comprising a dielectric substrate by printing, using a flexographic printing process with at least a first master plate and a first ink ("printable composition"), a first pattern on a first side of a dielectric substrate; and curing the printed dielectric article. A second ink can be similarly applied and cured to form a second pattern on a second surface of the substrate. Both patterns can contain seed metal catalyst that can then be electrolessly plated with a conductive material. The resulting dielectric article is described to have a thickness of 1 μm to 1 mm and a preferred surface energy of from 20 Dynes/cm to 90 Dynes/cm. The inks used in such methods are generally non-aqueous in nature and contain various photocurable components as well as dispersed metallic particles.

It is known to use various materials to disperse metallic particles in either aqueous or non-aqueous compositions. For example, U.S. Pat. No. 8,506,849 (Li et al.) describes curable conductive inks including metallic nanoparticles and separate polymeric dispersants. Magnetic inkjet printing inks comprising dispersed magnetic nanoparticles and polymeric dispersants are described in U.S. Pat. No. 8,597,420 (Iftime et al.). In other techniques, the outer surface of metallic nanoparticles are modified to incorporate hydrophobic tails to improve dispersibility in organic solvents for inkjet printing as described for example in U.S. Patent Application Publication 2008/0090082 (Shim et al.).

There is a need for improved printable compositions (also known as inks) that contain seed metal catalyst for electroless plating. It is desired to apply (for example, printing) such improved compositions as electrically-conductive patterns of lines with a desired coloration for optical effects, stability for successful manufacturing, and electroless printing performance.

Yet, the resulting article with the electrically-conductive pattern of lines must be highly transparent and not visible when it is viewed under lighting conditions where a reflective line is visible. For this purpose, it has been determined to treat the outer surface of electrically-conductive lines (for example, composed of copper) with a blackening agent to decrease reflectivity of the metallic wires.

However, in some display devices containing capacitive touch screens in which electrically-conductive patterns are provided on both sides of a transparent substrate, the top surface of the "blackened" electrically-conductive wires can be obscured, but the bottom surface is visible and reflective through the transparent substrate.

In order to maintain thin lines in the electrically-conductive patterns, it is desirable to apply thin layers of the seed metal catalyst ink, that is, apply only enough to induce electroless plating. If the ink lay down is too great, the ink will spread and provide wider lines and thereby reduce transparency of the article. Moreover, such thicker lines are more visible in the eventual articles and are less durable. Thus, thinner lines are desired in the patterns but this makes the electrolessly plated metal more visible in the lines through the transparent substrate.

Useful seed metal catalyst used in such materials includes metal such as particles of silver or copper. For desired properties, a sufficient amount of such metal particles can be 10% to 50% of the total weight of the ink or printable composition. At such amounts, the metal particles are generally reflective and can be readily seen through a transparent substrate, thereby adding to the visibility of the resulting electrically-conductive patterns. One attempt to reduce the reflectivity of the seed metal catalyst and electrolessly plated metals is to add sufficient colorant (such as carbon black) to the printable composition (ink) so that the seed metal catalyst is not visible. However, it is difficult to add sufficient amount of such colorants to the ink without undesirably increasing viscosity and clumping (aggregation or agglomeration) of metal particles in the ink.

Dispersants (or dispersing aids) have been commonly used to keep particulate materials in suspension as long as possible for various uses. However, it has not been possible to readily use a known dispersant with particular particles to minimize settling and particle-particle interactions that may undesirably increase viscosity of a given composition. In general, it has required considerable research and engineering in the various industries to find the best dispersants for chosen particulate materials, whether they are metallic, organic, or inorganic in nature. This has been particularly true for seed metal catalysts that are designed for electroless plating operations.

Thus, there is a need to provide a seed metal catalyst printable composition (ink) that has reduced reflectivity, small uniform particle size distribution with limited particle clumping, and suitable viscosity for application of patterns of thin lines using for example using flexographic printing.

SUMMARY OF THE INVENTION

To address the problem described above, the present invention provides a non-aqueous composition comprising dispersed carbon-coated metal particles in an organic diluent in an amount of at least 10 weight % based on the total weight of the non-aqueous composition, the dispersed carbon-coated metal particles having a median diameter equal to or less than 0.6 μm, and being dispersed with a particle dispersing agent that has a weight average molecule weight ($M_w$) of at least 2,000 and up to and including 100,000 and comprises nitrogen-containing units, the median diameter being determined using a dynamic light scattering method, wherein, when the non-aqueous composition contains up to and including 25 weight % of the dispersed carbon-coated metal particles, it exhibits no visual settling when subjected to a settling test of at least 24 hours at 20° C.

In some embodiments such non-aqueous compositions are non-aqueous photocurable compositions, each of which comprises:

dispersed carbon-coated metal particles present in an amount of at least 10 weight % based on the total weight of the non-aqueous photocurable composition, and the dispersed carbon-coated metal particles having a median diameter equal to or less than 0.6 μm, and being dispersed with a particle dispersing agent that has a weight average molecular weight ($M_w$) of at least 2,000 and up to and including 100,000 and comprises nitrogen-containing units, the median diameter being determined using a dynamic light scattering method, an organic diluent,
a UV-curable component, and
if needed, a UV photoinitiator, wherein, when the non-aqueous photocurable composition contains up to and including 25 weight % of the dispersed carbon-coated metal particles, it exhibits no visual settling when subjected to a settling test of at least 24 hours at 20° C.

The present invention provides a number of advantages with the uniquely dispersed carbon-coated metal particles described herein. In particular, these carbon-coated metal particles can be readily dispersed at higher concentrations (for example, at least 10 weight %) within the non-aqueous compositions by using a uniquely chosen particle dispersing agent.

It is also possible to reduce the reflectivity of the carbon-coated metal particles when they are incorporated into patterns of electrically-conductive lines formed by electroless plating methods.

The use of the particle dispersing agents according to the present invention minimizes particle-particle interactions that will increase viscosity of the non-aqueous compositions. By better dispersing especially the carbon-coated metal particles, a higher amount of such particles can be "loaded" into the non-aqueous compositions without an undesirable viscosity increase.

The particle dispersing agents used according to the present invention also facilitate the break-up and stabilization of smaller-sized carbon-coated metal particles that are less likely to settle. This is a serious problem for metallic particles such as silver nanoparticles because the settling rate is dependent upon metal particle size and particle density (10.5 g/cm³ for silver metal), according to the settling velocity derived from Stokes Law shown as follows:

$$V_s = \frac{2}{9}\frac{(\rho_{particle} - \rho_{fluid})}{\mu}gR^2$$

where Vs is the particle settling velocity (m/sec) (vertically downwards if $\rho_{particle} > \rho_{fluid}$; upwards if $\rho_{particle} < \rho_{fluid}$), g is the gravitational acceleration (m/sec²), $\rho_{particle}$ is the mass density of the particles (kg/m³), $\rho_{fluid}$ is the mass density of the fluid (kg/m³), μ is the dynamic viscosity (kg /m*s) and R is radius of the particle (m). Thus, it can be seen that the settling rate of metallic particles increases as $R^2$ and thus varies greatly with particle size.

It has also been observed that the non-aqueous compositions of this invention, including the non-aqueous photocurable compositions, exhibit improved shelf life with no settling between printing jobs or in areas of the printing system that receive little agitation.

When the non-aqueous compositions of the present invention are "printed" using suitable printing means as described below (for example, a flexographic printing member), the resulting images exhibit improved uniformity of particle distribution within the printed lines. This advantage provides better coverage of a given printed area using a smaller amount of costly carbon-coated metal particles and the improved uniformity provides more opaque dark lines that are desirable. With greater uniformity in coverage of smaller carbon-coated metal particles, electroless plating activity is improved compared to the situation when larger agglomerated metal particles are used.

DETAILED DESCRIPTION OF THE INVENTION

The following discussion is directed to various embodiments of the present invention and while some embodiments can be more desirable for specific uses, the disclosed embodiments should not be interpreted or otherwise considered to limit the scope of the present invention, as claimed below. In addition, one skilled in the art will understand that the following disclosure has broader application than is explicitly described and in the discussion of any embodiment.

DEFINITIONS

As used herein to define various components of the non-aqueous compositions and non-aqueous photocurable compositions, unless otherwise indicated, the singular forms "a," "an," and "the" are intended to include one or more of the components (that is, including plurality referents).

Each term that is not explicitly defined in the present application is to be understood to have a meaning that is customary or commonly accepted by those skilled in the art. If the construction of a term would render it meaningless or essentially meaningless in its context, the term definition can be taken from a standard published dictionary.

The use of numerical values in the various ranges specified herein, unless otherwise expressly indicated, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Median particle diameter [Dv (50%)] is determined using a dynamic light scattering method. For example, such a method can be carried out using a Malvern Zetasizer Nano ZS that can be obtained commercially from Malvern Instruments, Ltd. Instructions for using this equipment are available with the instrument.

Unless otherwise indicated, the terms "particle dispersing agent," "dispersant," and "dispersing aid" are meant to be equivalent.

The terms "epoxy monomer," "unsaturated monomer," "functional oligomer," "metal particles," and "crosslinking agent" are used herein with their usual meanings and are well understood by those having ordinary skill in the art.

As used herein, all molecular weights are weight average molecular weights ($M_w$) that can be determined using known procedures and equipment if the values are not already known from the literature. For example, $M_w$ can be determined using Size Exclusion Chromatography (SEC) and values are reported herein as poly(methyl methacrylate) equivalent weights.

As used herein, the term "photocuring" means the polymerization of functional oligomers and monomers, or even polymers, into a crosslinked polymer network, in response to irradiation of such materials, for example irradiation using ultraviolet (UV), visible, or infrared radiation at a suitable wavelength. Photocuring can be carried out in the presence of crosslinking agents.

The term "photocurable" is used to define a material (or component) that will polymerize or crosslink when irradiated with suitable radiation, for example irradiated with radiation such as ultraviolet (UV), visible, or infrared radiation in an appropriate environment.

The term "photocurable component" refers to an organic chemical compound (polymeric or non-polymeric) that can participate in a photocurable reaction. Such compounds can be the sole reactant to provide photocuring upon irradiation, or they can be combined with other co-reactants (such as photoinitiators or acid catalysts) to provide photocuring upon irradiation.

Unless otherwise indicated, the term "non-aqueous photocurable composition" refers to embodiments of the present invention that comprise one or more components that initiate or facilitate photocuring, which non-aqueous photocurable compositions are useful in the practice of the various methods described below and can be used to provide the articles described below. Such non-aqueous photocurable compositions have predominantly organic solvents or liquid organic components and have water at less than 5 weight %, or even at less than 1 weight %, based on the total non-aqueous photocurable composition weight.

The term "polymerization" is used herein to mean the combining, for example by covalent bonding, of a large number of smaller molecules, such as monomers, to form very large molecules, that is, macromolecules or polymers. The monomers can be combined to form only linear macromolecules or they can be combined to form three-dimensional macromolecules that are commonly referred to as crosslinked polymers. One type of polymerization that can be carried out in the practice of this invention is acid-catalyzed (cationic) polymerization. Another type of polymerization is free radical polymerization when free radically polymerizable materials and suitable free radical generating photoinitiators are present. In some useful embodiments of the present invention, both acid-catalyzed polymerization and free radically polymerization can be used simultaneously.

Average dry thickness of layers described herein can be determined from the average of at least 2 separate measurements taken of a dry layer, for example, using electron microscopy.

Similarly, the average dry thickness or width of lines, grid lines, or other pattern features described herein can be the average of at least 2 separate measurements taken, for example, using electron microscopy.

"Actinic radiation" is used to refer to any electromagnetic radiation that is capable of producing photocuring or photopolymerizing action in accordance with the present invention and that has a wavelength of at least 200 nm and up to and including 1400 nm, and typically at least 200 nm and up to and including 750 nm, or even at least 300 nm and up to and including 700 nm. The term "exposing radiation" also refers to such actinic radiation.

The term "UV radiation" is used herein to refer to electromagnetic radiation having a wavelength ($\lambda_{max}$) of at least 200 nm and up to and including 400 nm.

Uses

Photocuring is possible in the practice of this invention even when the non-aqueous photocurable compositions contains large amounts of the carbon-coated metal particles described herein, and they can be used in a variety of technologies such as graphic arts imaging (for example, in color proofing systems, as photocurable inks for ink jetting, or other imaging processes), electronic conformal coatings, coated abrasives, magnetic media, and photocurable composites, as well as the electroless plating processes described herein.

Additionally, a non-aqueous composition of this invention containing a dispersion of carbon-coated metal particles can be advantageously used for producing electronic materials, magnetic materials, magnetic recording materials, optical materials, gas sensor materials, catalytic materials, sintered materials, light reflective films, light absorption films or coatings, intermediate layers in functional assemblies, and other materials that would be readily apparent to a skilled worker in view of this teaching.

Thus, the non-aqueous compositions of this invention have various uses in any situation where dispersions of carbon-coated metal particles are needed for any particular purpose.

The non-aqueous compositions of this invention are particularly useful as non-aqueous photocurable compositions each of which contains at least one photocurable component. Such non-aqueous photocurable compositions can be photocured in any useful form, for example, as coatings on various substrates, fibers, patterns on various substrates, photocurable forms and molded articles, and adhesives.

More particularly, the non-aqueous photocurable compositions can be used for a variety of purposes where efficient photocuring is needed in various articles or devices. For example, such non-aqueous photocurable compositions can be designed to be sensitive to a chosen radiation wavelength and can be used for example, to provide patterns of seed metal catalysts that then can be further treated to form electrically-conductive metal patterns, for example using electroless plating procedures. Such electrically-conductive metal patterns can be designed and incorporated into various devices including but not limited to touch screen or other display devices that can be used in numerous consumer, industrial, and commercial products.

Touch screen technology can comprise different touch sensor configurations including capacitive and resistive touch sensors. Resistive touch sensors comprise several layers that face each other with a gap between adjacent layers that may be preserved by spacers formed during manufacturing. A resistive touch screen panel can comprise several layers including two thin, metallic, electrically conductive layers separated by a gap that can be created by spacers. When an object such as a stylus, palm, or fingertip presses down on a point on the panel's outer surface, the two metallic layers come into contact and a connection is formed that causes a change in the electrical current. This touch event is sent to a controller for further processing.

Capacitive touch sensors can be used in electronic devices with touch-sensitive features. These electronic devices can include but are not limited to, televisions, monitors, automated transfer machines, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices with touch-sensitive features to provide computing devices, computer displays, portable media players including e-readers, mobile telephones and other portable communicating devices.

Systems and methods of fabricating flexible and optically compliant touch sensors in a high-volume roll-to-roll manufacturing process where micro electrically-conductive features can be created in a single pass are possible using the present invention. The non-aqueous photocurable compositions can be used in such systems and methods with multiple printing members such as multiple flexographic printing plates to form multiple high resolution electrically-conductive images from predetermined designs of patterns provided in those multiple printing members. Multiple patterns can be printed on one or both sides of a transparent substrate as described in more details below. For example, one predetermined pattern can be formed on one side of the transparent substrate and a different predetermined pattern can be formed on the opposing side of the transparent substrate. Printed patterns of the non-aqueous photocurable compositions can then be "printed" as patterns on one or both sides a transparent substrate, which printed patterns can be further processed to provide electrically-conductive metal patterns for example using electroless metal plating.

Non-Aqueous Compositions

In their simplest form, the non-aqueous compositions of the present invention consist essentially of: (a) dispersed carbon-coated metal particles of the same or different composition, as described below; (b) one or more particle dispersing agents as described below; and (c) an organic diluent (liquid organic material) such as an organic solvent medium as described below, in which the carbon-coated metal particles (and potentially other components) are dispersed.

(a) Carbon-Coated Metal Particles

Usually only one type (composition) of carbon-coated metal particles is used in each non-aqueous composition, but it is also possible to include mixtures of different types of carbon-coated metal particles from the same or different classes of metals, that do not interfere with each other. Generally, each carbon-coated metal particle has a net neutral charge. In general, the carbon-coated metal particles are non-magnetic meaning that they do not show significant magnetism and thus, the non-aqueous compositions of the invention are likewise generally non-magnetic in nature.

Useful carbon-coated metal particles can comprise metal particles that are coated, at least partially, with carbon. The metal particles are composed of one or more metals (that is, pure metals or metal alloys) that are chosen from one or more classes of noble metals, semi-noble metals, Group IV metals, or combinations thereof. Useful noble metals include but are not limited to, gold, silver, palladium, platinum, rhodium, iridium, rhenium, mercury, ruthenium, and osmium. Useful semi-noble metals include but are not limited to, iron, cobalt, nickel, copper, carbon, aluminum, zinc, and tungsten. Useful Group IV metals include but are not limited to, tin, titanium, and germanium. The noble metals such as silver, palladium, and platinum are particularly useful, and the semi-noble metals of nickel and copper are also particularly useful. Tin is particularly useful in the Group IV metal class. In many embodiments, pure silver or copper is used in the non-aqueous photocurable compositions. Thus, in the practice of this invention, the term "metal" is intended to mean the same as "metallic," except that the terms "metal" and "metallic" are not intended to include metal salts, metal oxides, and metal hydrides.

The metal particles comprised of the noted metals are generally at least partially surface coated with carbon. Such carbon can be amorphous, sp2 hybridized, or graphene-like in nature.

Thus, particularly useful materials for use in the non-aqueous compositions are carbon-coated silver particles, carbon-coated copper particles, or in some embodiments, a mixture of carbon-coated silver particles and carbon-coated copper particles, all of which are dispersed in the organic solvent medium using one or more particle dispersing agents as described below.

The carbon-coated metal particles are designed to have a median particle diameter that is equal to or less than 0.6 µm, or less than 0.2 µm, or more likely less than 0.1 µm when measured in suspension by dynamic light scattering techniques. Such carbon-coated metal particles generally have a minimum median diameter of 0.005 µm.

Such carbon-coated metal particles can be present in any geometric shape including but not limited to, spheres, rods, prisms, cubes, cones, pyramids, wires, flakes, platelets, and combinations thereof, and they can be uniform or non-uniform in shapes and sizes. Optimal benefits of the present invention can be achieved using carbon-coated metal particles as individual particles or agglomerates of a few particles.

Each of the one or more particle dispersing agents in the non-aqueous compositions is used to disperse the carbon-coated metal particles so as to keep them from clumping or agglomerating in the non-aqueous compositions that also contain an organic diluent (as described below). Such particle dispersing agents are carefully chosen so the present invention can provide the desired advantages. Firstly, each particle dispersing agent has a weight average molecular weight ($M_w$) of at least 2,000 and up to and including 100,000, or more particularly up to and including 50,000. The most useful particle dispersing agents each have an $M_W$ of at least 3,000 and up to and including 30,000.

Moreover, each useful particle dispersing agent comprises two or more nitrogen-containing units, for example amide (carboxylic, sulfonic, sulfinic, phosphoric, phosphonic and many other acids that can form amides), amine (primary, secondary, tertiary), amine oxide, amidine (amide imine), azo, carbamate (urethanes), carbodiimide, diazo, diazonium, enamine, guanidine (imines of ureas), aromatic heterocyclic (pyridine, pyrimidine, pyridazine, pyrazine, pyrrole, imidazole, pyrazole, ozazole, isoxazole, thiazole, indole, indolizine, quinoline, isoquinoline), hydrazine, hydrazone, hydroxamic acid, imide, imine (Schiff bases), nitrate (esters of nitric acid), nitrile (cyanides), nitrite (esters of nitrous acid), nitro/nitroso (nitrosobenzene, nitrobenzene, nitromethane, N-nitrosourea), nitrone (imine N-oxides), oxime (imines of hydroxylamine), or urea (bisamides of carbonic acid such as N-methylurea, N-methylthiourea biuret allophanic acid, urazole, urazole) units or segments. Some particularly useful nitrogen-containing units are amide, amine, and imine units. In general, each of the particle dispersing agents has multiple nitrogen-containing units as they are at least oligomeric and have an $M_w$ of at least 2,000. Such nitrogen-containing units provide strong anchoring of the particle dispersing agents to the carbon-coated metal particles.

Each particle dispersing agent also contains functional groups that are compatible with organic polymers and with the organic solvents used in organic solvent medium of the non-aqueous composition. For polar, non-aqueous compositions useful nitrogen-containing units include ester, acrylate, or ether groups, or a combination thereof.

Some particularly useful particle dispersing agents are organic polymer comprising ester units such as those found in polyesters or (meth)acrylate polymers (homopolymers and copolymers).

In other embodiments, the particle dispersing agent is an organic polymer that comprises units chosen from at least one (one or more) of the following classes (i) through (iv):

(i) pyridine units such as in vinyl pyridines;

(ii) imine units (such as -alkylene-NH— units) including ethyleneimine and propyleneimine units, as can be found in polyethylene imines;

(iii) imide units [—C(═O)—NH—C(═O)— units]; and (iv) amine units (primary, secondary, and tertiary amine groups).

Mixtures of these particle dispersing agents, from the same or different classes of materials can be used if desired.

Some examples of useful particle dispersing agents that have these features are the following materials, including some commercial products:

Copolymers containing polyethylene imine segments, for example Solsperse® 35000 and Solsperse® 39000 (Lubrizol);

Copolymers containing ester and amine units in the form of block, branched, hyperbranched, and comb structures such as Disperbyk®-2155, Disperbyk®-2152, Disperbyk®-2013, BYK®-9077 (BYK/Altana) and Efka® PX 4731 and Efka® PX 4732 (BASF);

Acrylic block copolymers containing aliphatic or aromatic amine units such as Efka® PX 4701 (BASF); and Copolymers containing aliphatic or aromatic amine units such as Disperbyk®-2118 (BYK/Altana) and Tetronic® 150R (BASF).

The following essential components are included in the non-aqueous compositions in amounts so that the weight ratio of the particle dispersing agent to the dispersed carbon-coated metal particles is at least 1:100 or even at least 3:100 and up to and including 10:100 or up to and including 30:100. These weights refer to the total weight of all particle dispersing agents and the total weight of all carbon-coated metal particles in each non-aqueous composition.

Moreover, the amount of carbon-coated metal particles in each non-aqueous composition is at least 10 weight %, or at least 15 weight %, and up to and including 60 weight %, or even up to and including 70 weight %, based on the total weight of the non-aqueous composition (including the organic diluent). With this information, a skilled worker can then determine useful and optimal amounts of chosen particle dispersing agents for chosen carbon-coated metal particles.

In some particularly useful embodiments, the non-aqueous compositions comprise dispersed carbon-coated silver particles that are present at a concentration is at least 15 weight % and up to and including 60 weight % based on the total weight of the non-aqueous composition, and the dispersed carbon-coated silver particles have a median diameter of less than 0.5 µm determined as described above.

The non-aqueous compositions (including the non-aqueous photocurable compositions described below) also generally include an organic diluent that serves as a non-aqueous (organic) solvent or combination of solvents in which the components of the non-aqueous composition are dissolved or dispersed.

In some embodiments of the present invention, the organic diluent is an organic solvent medium that includes one or more inert organic solvents such as 2-ethoxyethanol, 2-(2-methoxyethoxy)ethanol, 2-(2-ethoxyethoxy)ethanol, 1-methoxy-2-propanol (Dowanol PM), 4-heptanone, 3-heptanone, 2-heptanone, cyclopentanone, cyclohexanone, diethyl carbonate, 2-ethoxyethyl acetate, N-butyl butyrate, acetone, dichloromethane, isopropanol, ethylene glycol, and methyl lactate. Mixtures of these listed inert organic solvents can be used in the organic solvent medium in any suitable volume or weight ratio. Other useful organic solvents could be readily identified by one skilled in the art using the teaching provided herein. By "inert," it is meant that the organic solvents do not appreciably participate in any chemical reactions.

When one or more photocurable components (as described below) are present as liquid organic compounds, those one or more photocurable components can act as the organic diluent and separate inert organic solvents may not be necessary. In such instances, the organic diluent can be considered a "reactive" diluent. Alternatively, one or more reactive diluents can be used in combination with one or more inert organic solvents (as described above) to form a suitable organic diluent.

The amount of organic diluent can be judiciously chosen depending upon the particular materials used, the means for applying the resulting non-aqueous composition, and desired properties including composition uniformity.

For example, the organic diluent can provide at least 10 weight % and up to and including 90 weight % or at least 20 weight % and up to and including 80 weight %, based on the total weight of the non-aqueous composition. The organic diluent typically includes little or no water, meaning that water is present in an amount of less than 5 weight % or even less than 1 weight %, based on the total weight of the non-aqueous composition.

While not essential to the non-aqueous compositions, an optional but desirable component is carbon black in an amount of at least 0.5 weight % and up to and including 20 weight %, or at typically at least 1 weight % and up to and including 10 weight %, based on the total weight of the non-aqueous composition.

As noted above, the non-aqueous composition of the present invention can be a non-aqueous photocurable composition that further comprises one or more photocurable components as described below. The amounts of such components can also be determined using the teaching provided below, but generally, only as much of the one or more photocurable components is present to provide sufficient photocuring in a particular use.

Some particularly useful non-aqueous photocurable compositions of the present invention comprise:

dispersed carbon-coated metal particles in an amount of at least 10 weight % or even at least 15 weight % and up to and including 60 weight % or up to and including 70 weight %, all based on the total weight of the non-aqueous photocurable composition, and the dispersed carbon-coated metal particles have a median diameter equal to or less than 0.6 µm, and are dispersed with a particle dispersing agent that has an $M_w$ of at least 2,000 and up to and including 100,000 and comprises nitrogen-containing units, the median diameter being determined using a dynamic light scattering method, all as described above, an organic diluent (as described above), a UV-curable component (as described below), and if needed, a UV photoinitiator (as described below), wherein, when the non-aqueous photocurable composition contains up to and including 25 weight % of the dispersed carbon-coated metal particles, it exhibits no visual settling when subjected to a settling test of at least 24 hours at 20° C. (which test is further defined above).

In such non-aqueous photocurable compositions, the dispersed carbon-coated metal particles can comprise dispersed carbon-coated silver particles or dispersed carbon coated-copper particles, or a mixture of both dispersed carbon-coated silver particles and dispersed carbon-coated copper particles, all of which are described below.

Moreover, the weight ratio of the particle dispersing agent to the dispersed carbon-coated metal particles in such non-aqueous photocurable compositions can be at least 1:100 and up to and including 30:100.

In some particularly useful non-aqueous photocurable compositions, the dispersed carbon-coated metal particles can be present in an amount of at least 15 weight % and up to and including 60 weight %, based on the total weight of the non-aqueous photocurable composition, and the dispersed carbon-coated metal particles (such as carbon-coated silver particles or carbon-coated copper particles) have a median diameter of less than 0.5 µm as determined using a dynamic light scattering method as described above.

The non-aqueous compositions of this invention can be prepared by suitably dispersing the carbon-coated metal particles with one or more of the particle dispersing agents using suitable dispersing means. Both of these essential components can be mixed or dispersed within the organic diluent for example an organic solvent medium (as described above) where the carbon-coated metal particles can be effectively dispersed.

The methods used to disperse the carbon-coated metal particles include but are not limited to, ball-milling, media milling, magnetic stirring, high speed homogenization, high pressure homogenization, shaker agitation, and ultrasonication. Ultrasonication is particularly useful for dispersing the carbon-coated metal particles with the particle dispersing agent in an organic diluent.

Media milling techniques are also useful for comminution of solid particles such as the carbon-coated metal particles used in this invention. Media milling can be accomplished using an attritor, a ball mill, a media mill, or a vibration mill using suitable media comprised of silica, silicon nitride, sand, zirconium oxide, alumina, titania, yttria, yttria-stabilized zirconia, zirconium silicate, glass, steel, or any other material known for such uses.

The non-aqueous photocurable composition of this invention can further comprise dispersed carbon black in an amount of at least 0.5 weight % and up to and including 20 weight %, or at least 1 weight % and up to and including 10 weight %, based on the total weight of the non-aqueous photocurable composition.

Acid-Catalyzed Photocurable Chemistries:

In some embodiments of the present invention, the non-aqueous photocurable composition comprises one or more UV-curable components at least one of which is an acid-catalyzed photocurable component. Such non-aqueous photocurable compositions can further comprises a photoacid generator.

Some useful acid-catalyzed photocurable component can be photocurable epoxy materials. Cationically photocurable epoxy materials ("epoxides") useful in the present invention are organic compounds having at least one oxirane ring, which oxirane ring is shown in the following formula:

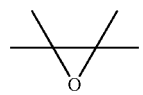

that is polymerizable by a ring opening mechanism. Such epoxy materials include monomeric epoxy compounds and epoxides of the polymeric type and can be aliphatic, cycloaliphatic, aromatic or heterocyclic. These materials generally have, on the average, at least one polymerizable epoxy group per molecule, or typically at least about 1.5 or even at least about 2 polymerizable epoxy groups per molecule. Polymeric epoxy materials include linear polymers having terminal epoxy groups (for example, a diglycidyl ether of a polyoxyalkylene glycol), polymers having skeletal (backbone) oxirane units (for example, polybutadiene polyepoxide), and polymers having pendant epoxy groups (for example, a glycidyl methacrylate polymer or copolymer).

The photocurable epoxy materials can be single compounds or they can be mixtures of different epoxy materials containing one, two, or more epoxy groups per molecule. The "average" number of epoxy groups per molecule is determined by dividing the total number of epoxy groups in the epoxy material by the total number of epoxy-containing molecules present.

The epoxy materials can vary from low molecular weight monomeric materials to high molecular weight polymers and they can vary greatly in the nature of the backbone and substituent (or pendant) groups. For example, the backbone can be of any type and substituent groups thereon can be any group that does not substantially interfere with cationic photocuring process desired at room temperature. Illustrative of permissible substituent groups include but are not limited to, halogens, ester groups, ethers, sulfonate groups, siloxane groups, nitro groups, and phosphate groups. The molecular weight of the epoxy materials can be at least 58 and up to and including 100,000, or even higher.

Useful epoxy materials include those that contain cyclohexene oxide groups such as epoxycyclohexane carboxylates, such as 3,4-epoxycyclohexylmethyl-3,4-epoxycyclohexane carboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxy materials of this nature is provided in U.S. Pat. No. 3,117,099 (Proops et al.).

Still other useful epoxy materials include glycidyl ether monomers that are glycidyl ethers of polyhydric phenols obtained by reacting a polyhydric phenol with an excess of a chlorohydrin such as epichlorohydrin [for example, the diglycidyl ether of 2,2-bis-(2,3-epoxypropoxyphenol)-propane]. Further examples of epoxy materials of this type are described in U.S. Pat. No. 3,018,262 (Schroeder) and in "Handbook of Epoxy Resins" by Lee and Neville, McGraw-Hill Book Co., New York (1967).

Still other useful epoxy materials are resins such as copolymers derived from acrylic acid esters reacted with glycidol such as glycidyl acrylate and glycidyl methacrylate, copolymerized with one or more ethylenically unsaturated polymerizable monomers.

Other useful epoxy materials are epichlorohydrins such as epichlorohydrin, alkylene oxides such as propylene oxide and styrene oxide, alkenyl oxides such as butadiene oxide, and glycidyl esters such as ethyl glycidate.

Still other useful epoxy materials are silicones having an epoxy functionality or group such as cyclohexylepoxy groups, especially those epoxy materials having a silicone backbone. Commercial examples of such epoxy materials include UV 9300, UV 9315, UV 9400, UV 9425 silicone materials that are available from Momentive.

Polymeric epoxy materials can optionally contain other functionalities that do not substantially interfere with cationic photocuring of the non-aqueous photocurable composition at room temperature. For example, the photopolymerizable epoxy materials can also include free-radically polymerizable functionality.

The photopolymerizable epoxy material can comprise a blend or mixture of two or more different epoxy materials. Examples of such blends include two or more molecular weight distributions of photopolymerizable epoxy materials, such as a blend of one or more low molecular weight (below 200) epoxy materials with one or more intermediate molecular weight (from 200 to 10,000) photopolymerizable epoxy materials, or one or more of such photopolymerizable epoxy materials with one or more higher molecular weight (above about 10,000) epoxy materials. Alternatively or additionally, the photopolymerizable epoxy material can comprise a blend of epoxy materials having different chemical natures, such as aliphatic and aromatic natures, or different functionalities, such as polar and non-polar properties. Other cationically polymerizable monomers or polymers can additionally be incorporated into the photopolymerizable epoxy material.

One or more photocurable epoxy materials are included in the non-aqueous photocurable composition in a suitable amount to provide the desired efficient photocuring (or photopolymerization). For example, the one or more photopolymerizable epoxy materials can be present in an amount of at least 5 weight % and up to and including 50 weight %, or typically of at least 10 weight % and up to and including 40 weight %, based on the total weight of the non-aqueous photocurable composition.

Various compounds can be used as photoacid generators to generate a suitable acid to participate in the photocuring of the epoxy materials. Some of these "photoacid generators" are acidic in nature and others are nonionic in nature. Other useful photoacid generators besides those described below would be readily apparent to one skilled in the art in view of the teaching provided herein. The various compounds useful as photoacid generators can be purchased from various commercial sources or prepared using known synthetic methods and starting materials.

Onium salt acid generators useful in the practice of this invention include but are not limited to, salts of diazonium, phosphonium, iodonium, or sulfonium salts including polyaryl diazonium, phosphonium, iodonium, and sulfonium salts. The iodonium or sulfonium salts include but not limited to, diaryliodonium and triarylsulfonium salts. Useful counter anions include but are not limited to complex metal halides, such as tetrafluoroborate, hexafluoroantimonate, trifluoromethanesulfonate, hexafluoroarsenate, hexafluorophosphate, and arenesulfonate. The onium salts can also be oligomeric or polymeric compounds having multiple onium salt moieties as well as molecules having a single onium salt moiety.

Examples of useful aromatic iodonium salts include but are not limited to, diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl) iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl) iodonium hexafluorophosphate; di(4-bromophenyl) iodonium hexafluorophosphate; di(4-methoxyphenyl) iodonium hexafluorophosphate; di(3-carboxyphenyl) iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and mixtures thereof. Such compounds can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Other suitable iodonium salts include compounds that are described in U.S. Pat. No. 5,545,676 (Palazzotto et al.) at column 2 (lines 28 through 46), as well as in U.S. Pat. No. 3,729,313 (Smith), U.S. Pat. No. 3,741,769 (Smith), U.S. Pat. No.3,808,006 (Smith), U.S. Pat. No. 4,250,053 (Smith), and U.S. Pat. No. 4,394,403 (Smith).

Useful iodonium salts can be simple salts (for example, containing an anion such as chloride, bromide, iodide, or $C_4H_5SO_3^-$) or a metal complex salt (for example, containing $SbF_6^-$, $PF_6^-$, $BF_4^-$, tetrakis(perfluorophenyl)borate, or $SbF_5OH_{31}$ $AsF_6^-$). Mixtures of any of these iodonium salts of the same or different class can be used if desired.

Exemplary sulfonium salts include but are not limited to, triphenylsulfonium tetrafluoroborate, methyldiphenylsulfonium tetrafluoroborate, dimethylphenylsulfonium hexafluorophosphate, triphenylsulfonium hexafluorophosphate, triphenylsulfonium hexafluoroantimonate, diphenylnaphthylsulfonium hexafluoroarsenate, tritolylsulfonium hexafluorophosphate, anisyldiphenylsulfonium hexafluoroantimonate, 4-butoxyphenyldiphenylsulfonium tetrafluoroborate, 4-chlorophenyldiphenyl-sulfonium hexafluorophosphate, tri(4-phenoxyphenyl)sulfonium hexafluorophosphate, di(4-ethoxyphenyl)methylsulfonium hexafluoroarsenate, 4-acetonylphenyldiphenylsulfonium tetrafluoroborate, 4-thiomethoxyphenyl-diphenylsulfonium hexafluorophosphate, di(methoxysulfonylphenyl)methylsulfonium hexafluoroantimonate, di(nitrophenyl)phenylsulfonium hexafluoroantimonate, di(carbomethoxyphenyl)methylsulfonium hexafluorophosphate, 4-acetamidophenyldiphenylsulfonium tetrafluoroborate, dimethylnaphthylsulfonium hexafluorophosphate, trifluoromethyldiphenyl-sulfonium tetrafluoroborate, p-(phenylthiophenyl)diphenylsulfonium hexafluoroantimonate, p-(phenylthiophenyl)diphenylsulfonium hexafluorophosphate, di-[p-(phenylthiophenyl)]phenylsulfonium hexafluoroantimonate, di-[p-(phenylthiophenyl)]phenylsulfonium hexafluorophosphate, 4,4'-bis(diphenylsulfonium) diphenylsulfide bis(hexafluoroantimonate), 4,4'-bis(diphenylsulfonium)diphenylsulfide bis(hexafluorophosphate), 10-methylphenoxathiinium hexafluorophosphate 5-methylthianthrenium hexafluorophosphate, 10-phenyl-9,9-dimethylthioxanthenium hexafluorophosphate, 10-phenyl-9-oxothioxanthenium tetrafluoroborate, 5-methyl-10-oxothianthrenium tetrafluoroborate, 5-methyl-10,10-dioxothianthrenium hexafluorophosphate, and mixtures thereof.

Sulfonium salts are desirable for use and should be soluble in any inert organic solvents (described below) and they should also be shelf-stable, meaning they do not spontaneously promote polymerization when mixed with the other components especially the electron acceptor photosensitizer and electron donor co-initiator prior to exposure to suitable radiation. Accordingly, selection of a particular onium salt can be made for optimum properties with the other components and amounts.

Particularly useful sulfonium salts include but are not limited to, triaryl-substituted salts such as mixed triarylsulfonium hexafluoroantimonates (for example, commercially available as UVI-6974 from Dow Chemical Company), mixed triarylsulfonium hexafluorophosphates (for example, commercially available as UVI-6990 from Dow Chemical Company), and arylsulfonium hexafluorophosphates (for example, commercially available as SarCa™ KI85 from Sartomer Company).

One or more onium salts (such as an iodonium salt or a sulfonium salt) can be generally present in the non-aqueous photocurable composition in an amount of at least 0.05 weight % and up to and including 10 weight %, or typically at least 0.1 weight % and up to and including 10 weight %, or even at least 0.5 weight % and up to and including 5 weight %, based on the total weight of the non-aqueous photocurable composition.

Nonionic photoacid generators are also useful in present invention, which compounds include but are not limited to, diazomethane derivatives such as, for example, bis(benzenesulfonyl)diazomethane, bis(p-toluenesultonyl)diazomethane, bis(xylenesulfonyl)diazomethane, bis(cyclohexylsulfonyl)-diazomethane, bis(cyclopentylsulfonyl)diazomethane, bis(n-butylsulfonyl) diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butyl sulfonyl)diazomethane, 1-cyclohexylsulfonyl-1-(tert-amylsulfonyl)diazomethane, and 1-tert-amylsulfonyl-1-(tert-butyl sulfonyl)diazomethane.

Nonionic photoacid generators can also include glyoxime derivatives such as, for example, bis-o-(p-toluenesulfonyl)-α-dimethylglyoxime, bis-o-(p-toluenesulfonyl)-α-diphenylglyoxime, bis-o-(p-toluenesulfonyl)-α-dicyclohexyl-glyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(t-butanesulfonyl)-α-dimethylglyoxime, bis-o-(perfluorooctanesulfonyl)-α-dimethylglyoxime, bis-o-(cyclohexane-sulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-t-butylbenzenesulfonyl)-α-dimethylglyoxime, bis-o-(xylenesulfonyl)-α-dimethylglyoxime, or bis-o-(camphorsulfonyl)-α-dimethylglyoxime.

Such photoacid generators can also include bissulfone derivatives such as, for example, bisnaphthylsulfonylmethane, bistrifluoromethylsulfonylmethane, bismethylsulfonylmethane, bisethylsulfonylmethane, bispropylsulfonylmethane, bisisopropyl-sulfonylmethane, bis-p-toluenesulfonylmethane, bisbenzenesulfonylmethane, 2-cyclohexyl-carbonyl-2-(p-toluenesulfonyl)propane (β-ketosulfone derivative), and 2-isopropyl-carbonyl-2-(p-toluenesulfonyl)propane (β-ketosulfone derivative).

Other classes of useful nonionic photoacid generators include disulfono derivatives such as, for example, diphenyl disulfone and dicyclohexyl disulfone; nitrobenzyl sulfonate derivatives such as, for example, 2,6-dinitrobenzyl p-toluenesulfonate and 2,4-dinitrobenzyl p-toluenesulfonate; sulfonic acid ester derivatives such as, for example, 1,2,3-tris(methanesulfonyl-oxy)benzene, 1,2,3-tris(trifluoro-methanesulfonyloxy)benzene, and 1,2,3-tris(p-toluenesulfonyloxy)benzene; and sulfonic acid esters of N-hydroxyimides such as, for example, N-hydroxysuccinimide methanesulfonate, N-hydroxy-succinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trifluoro-benzenesulfonate, N-hydroxysuccinimide 2,4,6-trimethyl-benzenesulfonate, N-hydroxysuccinimide 2,4,6-trichloro-benzenesulfonate, N-hydroxysuccinimide 4-cyano-benzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxylmide methanesulfonate, N-hydroxy-5-norbornene-2,3-dicarboxylmide trifluoromethanesulfonate, N-hydroxy-5-norbornene-2,3-dicarboxylmide p-toluenesulfonate, N-hydroxynaphthalimide triflate, and N-hydroxy-5-norbomene-2,3-dicarboximide perfluoro-1-butanesulfonate.

One or more nonionic photoacid generators can be present in the non-aqueous photocurable composition in an amount of at least 0.05 weight % and up to and including 10 weight %, or typically at least 0.1 weight % and up to and including 10 weight %, or even at least 0.5 weight % and up to and including 5 weight %, based on the total weight of the non-aqueous photocurable composition.

Some non-aqueous photo curable compositions described herein, especially those containing photopolymerizable epoxy materials and photoacid generators, can contain one or more electron donor photosensitizers. Useful electron donor photosensitizers should be soluble in the non-aqueous photocurable composition, free of functionalities that would substantially interfere with the cationic photocuring process, and capable of light absorption (sensitivity) within the range of wavelengths of at least 150 nm and up to and including 1000 nm.

Suitable electron donor photosensitizers initiate the chemical transformation of the onium salt (or other photoacid generator) in response to the photons absorbed from the irradiation. The electron donor photosensitizer should also be capable of reducing the photoacid generator after the electron donor photosensitizer has absorbed light (that is, photoinduced electron transfer). Thus, the electron donor photosensitizer, upon absorption of photons from irradiation, is generally capable of donating an electron to the photoacid generator.

When very rapid curing (such as the curing of thin applied films of the non-aqueous photocurable compositions) is desired, the electron donor photosensitizers can have an extinction coefficient of at least 1000 liter-mole$^{-1}$ cm$^{-1}$ and typically at least 50,000 liters-mole$^{-1}$ cm$^{-1}$ at the desired irradiation wavelength using the photocuring process.

For example, each of the electron donor photosensitizers generally has an oxidation potential of at least 0.4 V and up to and including 3 V vs. SCE, or more typically of at least 0.8 V and up to and including 2 V vs. SCE.

In general, many different classes of compounds can be used as electron donor photosensitizers for various reactants. Useful electron donor photosensitizers include but are not limited to, aromatics such as naphthalene, 1-methylnaphthalene, anthracene, 9,10-dimethoxyanthracene, benz[a]anthracene, pyrene, phenanthrene, benzo[c]phenanthrene, and fluoranthene.

Other useful electron donor photosensitizers that involve the triplet excited state are carbonyl compounds such as thioxanthones and xanthones. Ketones including aromatic ketones such as fluorenone, and coumarin dyes such as ketocoumarins such as those with strong electron donating moieties (such as dialkylamino) can also be used as electron donor photosensitizers. Other suitable electron donor photosensitizers are believed to include xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriarylmethanes, merocyanines, squarylium dyes, and pyridinium dyes.

It is also possible to use a mixture of electron donor photo sensitizers that are chosen from the same or different classes of materials.

Various useful electron donor photosensitizers are available from various commercial sources and can be readily found for use in the present invention.

When used, one or more electron donor photosensitizers can be present in the non-aqueous photocurable composition in an amount of at least 0.000001 weight % and up to and including 5 weight %, and typically at least 0.0001 weight % and up to and including 2 weight %, based on the total weight of the non-aqueous photocurable composition. Exact amounts of required electron donor photosensitizers depend on overall non-aqueous photocurable composition, its intended use, and the extinction coefficient.

In some embodiments, the electron donor photosensitizer is a pyrene, benzopyrene, perylene, or benzoperylene that is present in an amount of at least 0.0001 weight % and up to and including 2 weight %, based on the total weight of the non-aqueous photocurable composition.

In some non-aqueous photocurable compositions of this invention, the electron donor photosensitizer can be replaced with a combination of one or more electron acceptor photosensitizer and one or more electron donor co-initiators.

Useful electron acceptor photosensitizers should be soluble in the non-aqueous photocurable composition, free of functionalities that would substantially interfere with the cationic photocuring process, and capable of light absorption (sensitivity) within the range of wavelengths of at least 150 nm and up to and including 1000 nm.

Suitable electron acceptor photosensitizers initiate the chemical transformation of the onium salt in response to the photons absorbed from the irradiation. The electron acceptor photosensitizer should also be capable of oxidizing the electron donor co-initiator (described below) to a radical cation after the electron acceptor photosensitizer has absorbed light (that is, photoinduced electron transfer). Thus, the electron acceptor photosensitizer, upon absorption of photons from irradiation, is generally capable of accepting an electron from the electron donor co-initiator.

When very rapid curing (such as the curing of thin applied films of the compositions) is desired, the electron acceptor photosensitizers can have an extinction coefficient of at least 1000 liter-mole$^{-1}$ cm$^{-1}$ and typically at least 10,000 liters-mole$^{-1}$ cm$^{-1}$ at the desired irradiation wavelength using the photocuring process.

In general, many different classes of compounds can be used as electron acceptor photosensitizers for various reactants, provided that the energetic requirements discussed above are satisfied. Useful electron acceptor photosensitizers include but are not limited to, cyanoaromatics such as 1-cyanonaphthalene, 1,4-dicyanonaphthalene, 9,10-dicyanoanthracene, 2,9,10-tricyanoanthracene, 2,6,9,10-tetracyanoanthracene; aromatic anhydrides and imides such as 1,8-naphthylene dicarboxylic, 1,4,6,8-naphthalene tetracarboxylic, 3,4-perylene dicarboxylic, and 3,4,9,10-perylene tetracarboxylic anhydride or imide; condensed pyridinium salts such as quinolinium, isoquinolinium, phenanthridinium, acridinium, and pyrylium salts.

Other useful electron acceptor photosensitizers that involve the triplet excited state are carbonyl compounds such as quinones such as benzo-, naphtho-, anthro-quinones having electron withdrawing substituents (such as chloro and cyano). Ketones including aromatic ketones such as fluorenone, and coumarin dyes such as ketocoumarins such as those with strong electron withdrawing moieties (such as pyridinium) can also be used as electron acceptor photosensitizers. Other suitable electron acceptor photosensitizers are believed to include xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes and pyridinium dyes. Diarylketones and other aromatic ketones such as fluorenone are useful electron acceptor photo sensitizers.

As long as electrochemical requirements described above are satisfied, it is also possible to use a mixture of electron acceptor photosensitizers that are chosen from the same or different classes of materials.

Various useful electron acceptor photosensitizers are available from various commercial sources.

The one or more electron acceptor photosensitizers can be present in the non-aqueous photocurable composition in an amount of at least 0.000001 weight % and up to and including 5 weight %, and typically at least 0.0001 weight % and up to and including 2 weight %, based on the total weight of the non-aqueous photocurable composition.

The use of the electron acceptor photosensitizers is highly effective by the inclusion of one or more electron donor co-initiators in the non-aqueous photocurable composition, each of which electron donor co-initiator has an oxidation potential of at least 0.1V and up to and including 3V vs. SCE. Thus, such electron donor co-initiators should be soluble in the non-aqueous photocurable composition. The electron donor co-initiator can also be selected by consideration of other factors, such as shelf stability and the nature of the chosen photopolymerizable epoxy materials, photoacid generators, and electron acceptor photosensitizers.

Useful electron donor co-initiators are alkyl aromatic polyethers, arylalkylamino compounds wherein the aryl group is substituted by one or more electron withdrawing groups including but not limited to, carboxylic acid, carboxylic acid esters, ketones, aldehydes, sulfonic acid, sulfonates, and nitrile groups. For example, aryl dialkyldiamino compounds are useful in which the aryl is a substituted or unsubstituted phenyl or naphthyl group (such a phenyl or naphthyl group with one or more electron withdrawing groups as noted above), and the two alkyl groups independently comprise 1 to 6 carbon atoms.

The useful electron donor co-initiators can be readily obtained from a number of commercial sources.

In general, the one or more electron donor co-initiators can be present in an amount at least 0.001 weight % and up to and including 10 weight %, or more typically of at least 0.005 weight % and up to and including 5 weight %, or even at least 0.01 weight percent and up to and including 2 weight %, based on the total weight of the non-aqueous photocurable composition.

As noted above, all of the non-aqueous photocurable compositions containing various essential and optional components can comprise dispersed carbon black in an amount of at least 0.5 weight % and up to and including 20 weight %, or at least 1 weight % and up to and including 10 weight %, based on the total weight of the non-aqueous photocurable composition.

Some embodiments of non-aqueous photocurable compositions of the present invention can comprise each of component (a) photopolymerizable epoxy material as described above, (b) photoacid generator as described above, (c) electron donor photosensitizer as described above, (d) dispersed carbon-coated metal particles as described above with any of the particle dispersing agents as described above, (e) an organic diluent such as an organic solvent medium as described above, (f) a free-radically polymerizable material, and (g) a free radical photoinitiator, wherein:

the photopolymerizable epoxy material has at least two polymerizable epoxy groups per molecule, the photoacid generator is an iodonium or sulfonium, and the dispersed carbon-coated metal particles are dispersed carbon coated-silver particles that have a median diameter equal to or less than 0.5 μm as determined using a dynamic light scattering method as described above.

Free Radical Photocurable Chemistries:

In other embodiments, the non-aqueous photocurable compositions comprise one or more UV-curable components at least one of which is a free radically photocurable component and the non-aqueous photocurable composition can further comprise a free radical photoinitiator to provide free radicals during photocuring.

The one or more free-radically polymerizable compounds can be present to provide free-radically polymerizable functionality, including ethylenically unsaturated polymerizable monomers, oligomers, or polymers such as mono-functional or multi-functional acrylates (also includes methacrylates). Such free-radically polymerizable compounds comprise at least one ethylenically unsaturated polymerizable bond (moiety) and they can comprise two or more of these unsaturated moieties in many embodiments. Suitable materials of this type contain at least one ethylenically unsaturated polymerizable bond and are capable of undergoing addition (or free radical) polymerization. Such free radically polymerizable materials include mono-, di-, or poly-acrylates and methacrylates including but not limited to, methyl acrylate, methyl methacrylate, ethyl acrylate, isopropyl methacrylate, n-hexyl acrylate, stearyl acrylate, allyl acrylate, glycerol diacrylate, glycerol triacrylate, ethylene glycol diacrylate, diethylene glycol diacrylate, triethylene glycol dimethacrylate, 1,3-propanediol diacrylate, 1,3-propanediol dimethacrylate, 1,4-butanediol diacrylate, 1,6-hexanediol diacrylate, neopentyl glycol diacrylate, neopentyl glycol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, dipentaetrythritol hexaacrylate, sorbitol hexaacrylate, bis[1-(2-acryloxy)]-p-ethoxyphenyldimethylmethane, bis[1-(3-acryloxy-2-hydroxy)]-p-propoxyphenyldimethylmethane, and tris-hydroxyethyl-isocyanurate trimethacrylate; the bis-acrylates and bis-methacrylates of polyethylene glycols having a molecular weight of from 200 to and including 500, co-polymerizable mixtures of acrylate monomers such as those described in U.S. Pat. No. 4,652,274 (Boettcher et al.) and acrylate oligomers such as those described in U.S. Pat. No. 4,642,126 (Zader et al.); and vinyl compounds such as styrene and styrene derivatives, diallyl phthalate, divinyl succinate, divinyl adipate, and divinyl phthalate. Mixtures of two or more of these free radically polymerizable materials can be used if desired.

Such materials can be purchased from a number of commercial sources or prepared using known synthetic methods and starting materials.

Although the amount of the one or more free radically polymerizable materials is not particularly limited, they can be present in the non-aqueous photocurable compositions in an amount of at least 10 weight % and up to and including 90 weight % or typically of at least 20 weight % and up to and including 85 weight %, based on the total weight of the non-aqueous photocurable composition and can be optimized based on the desired properties of composition solubility and mechanical strength of the resulting photocured composition.

One or more free radical photoinitiators can also be present in the non-aqueous photocurable compositions to generate free radicals. Such free radical photoinitiators include any compound that is capable of generating free radicals upon exposure to photocuring radiation used in the practice of this invention such as ultraviolet or visible radiation. For example, free radical photoinitiators can be selected from triazine compounds, thioxantone compounds, benzoin compounds, carbazole compounds, diketone compounds, sulfonium borate compounds, diazo compounds, and biimidazole compounds, and others that would be readily apparent to one skilled in the art. Mixtures of such compounds can be selected from the same or different classes.

Also useful are benzophenone compounds such as benzophenone, benzoyl benzoate, methyl benzoyl benzoate, 4-phenyl benzophenone, hydroxyl benzophenone, acrylated benzophenone, 4,4'-bis(dimethylamino)benzophenone and 4,4'-bis(diethylamino)benzophenone, anthraquinone compounds, and acetophenone compounds such as 2,2'-diethoxyacetophenone, 2,2'-dibutoxyacetophenone, 2-hydroxy-2-methylpropiophenone, p-t-butyltrichloroacetophenone, p-t-butyldichloroacetophenone, benzophenone, 4-chloroacetophenone, 4,4'-dimethylaminobenzophenone, 4,4'-dichlorobenzophenone, 3,3'-dimethyl-2-methoxybenzophenone, 2,2'-dichloro-4-phenoxyacetophenone, 2-methyl-1-(4-(methylthio)phenyl)-2-morpholinopropan-1-one, and 2-benzyl-2-dimethylamino-1-(4-morpholinophenyl)-butane-1-one. Further useful compounds of this type are described for example in U.S. Pat. No. 7,875,416 (Park et al.).

Many of such free radical photoinitiators can be obtained from various commercial sources.

One or more free radical photoinitiators can be present in the non-aqueous photocurable composition in an amount of at least 0.3 weight % and up to and including 10 weight %, or typically at least 0.4 weight % and up to and including 10 weight %, or even at least 0.5 weight % and up to and including 5 weight %, based on the total weight of the non-aqueous photocurable composition.

In some of these embodiments, the non-aqueous photocurable composition comprises one or more free-radically polymerizable materials as described above, one or more free radical photoinitiators as described above, dispersed carbon-coated silver particles as described above, an organic solvent medium, wherein an acrylate is present as one of the free radically polymerizable component.

Preparing Non-Aqueous Photocurable Compositions

To prepare the non-aqueous photocurable compositions of this invention, the various components, including essential components and optional components, are combined in any suitable manner, for example in a suitable organic diluent (such as an organic solvent medium) unless a photocurable component serves as the organic diluent (as described above). Thus, such combining processes can mix suitable dispersed carbon-coated metal particles as described above (including a particle dispersing agent as described above), and one or more photocurable components (as described above) in an organic diluent. Such photocurable components can include a UV-curable component and a UV photoinitiator. Alternatively, the photocurable components can include a polymerizable epoxy material and a photoacid generator.

The resulting non-aqueous photocurable composition can be provided as a fluid, gel, or paste having a viscosity of at least 1 centipoise and up to and including 100,000 centipoises at 25° C. The non-aqueous photocurable composition can be applied to a variety of substrates (described below) by conventional means and photocured to the tack-free state within 1 second or up to 10 minutes or more using various curing means and sources of irradiation. Simultaneously or prior to photocuring, any inert organic solvents may be removed using suitable drying means.

Particularly useful inert organic solvents useful for this mixing (besides those described above), include but are not limited to acetone, methanol, ethanol, isopropanol, 1-methoxy-2-propanol (Dowanol PM), methylene chloride, and mixtures thereof that do not react appreciably with any of the reactive components of the non-aqueous photocurable compositions.

Articles

The non-aqueous photocurable compositions of this invention can be formulated as described above and applied to one or both supporting sides (planar sides) of any suitable substrate (described below) using any suitable manner. For example, the non-aqueous photocurable composition can be applied in a uniform or pattern-wise manner to either or both supporting sides using for example dip coating, roll coating, hopper coating, spray coating, spin coating, ink jetting, photolithographic imprinting, flexographic printing using flexographic printing members (such as flexographic printing plates and flexographic printing sleeves), lithographic printing using lithographic printing plates, and gravure or intaglio printing using appropriate printing members. Flexographic printing using flexographic printing members are particularly useful to provide predetermined patterns of the non-aqueous photocurable composition, and this method can be used to provide multiple patterns of the same or different non-aqueous photocurable compositions on one or both supporting sides of the substrate. More details of such processes are provided below.

The applied non-aqueous photocurable composition can be formed and dried into a uniform layer or a dried into a predetermined pattern. The resulting articles can be considered "precursor" articles before photocuring is carried out as described below.

As noted below in more detail, the substrates for such articles can be composed of any useful material(s) and can be individual films or sheets of any suitable sizes and shapes for example composed of a metallic material, glass, paperstock (any type of cellulosic material) or ceramic, or they can be continuous webs of materials such as continuous polymeric webs.

The various amounts of essential and optional components of the non-aqueous compositions (including the non-aqueous photocurable compositions) are described above but are to be understood that they refer to solutions of dispersions containing such components. However, it should be understood that upon application to a suitable substrate, and optional drying, and then photocuring, the amounts of various components are different within the applied non-aqueous composition. The individual amounts and relative amounts of the remaining components (if for example, inert organic solvents have been removed) can be readily calculated from the information of the amounts of components within the non-aqueous composition before application to a substrate.

For example, in the dried non-aqueous compositions (including dried non-aqueous photocurable compositions), the carbon-coated metal particles can be present in an amount of at least 10 weight % and up to and including 90 weight %, the particle dispersing agent(s) can be present in an amount of at least 1 weight % and up to and including 30 weight %, carbon particles can be present in an amount of up to and including 20 weight %, and photocurable components (described above, before curing) can be present in amounts of up to and including 90 weight %.

Use of Non-Aqueous Photocurable Compositions

The non-aqueous photocurable compositions described herein can be photocured (or photopolymerized) using suitable radiation including ultraviolet light or visible actinic light, or both. One or more suitable light sources can be used for the exposure process. Each precursor article can be exposed individually as a single element, or in alternative embodiments described below, a web (for example, a roll-to-roll continuous polymeric web) comprising multiple precursor articles (comprising multiple photocurable patterns) in multiple portions on one or both supporting sides of the continuous polymeric web can be exposed individually as the continuous polymeric web is passed through exposure stations, or as an exposure device is passed in a desired path over the continuous polymeric web. The same or different non-aqueous photocurable compositions can be applied (for example, printed using flexography) on both supporting sides of the substrate whether the substrate is in the form of a single element or continuous polymeric web. In many embodiments, different electrically-conductive metal patterns can be formed on opposing supporting sides of the substrate (or continuous polymeric web) using the non-aqueous photocurable compositions described herein.

Desirable photocuring can be achieved using UV or visible irradiation having a wavelength of at least 184.5 nm to and including 700 nm and at intensity of at least 1 mJ/cm$^2$ and up to and including 1000 mJ/cm$^2$ or more typically of at least 1 mJ/cm$^2$ and up to and including 800 mJ/cm$^2$.

When the non-aqueous photocurable composition is uniformly applied to a suitable substrate, the resulting uniform dried layer can be "imaged" or selectively exposed (or patterned) with exposing radiation through a suitable photomask (masking element) having a desired pattern, and then appropriately removing the non-crosslinked (non-cured) photocurable composition using a suitable "developer" solution that solubilizes or disperses the non-photocured material. These features or steps can be carried out on both (opposing) supporting sides of the substrate. Moreover, multiple patterns can be formed in the dried layer if desired using the same or different photomasks.

More particularly, predetermined patterns of one or more non-aqueous photocurable compositions can be formed on a suitable substrate using methods as described below.

Suitable substrates (also known as "receiver elements" in the art) useful to provide precursor articles can be composed of any suitable material as long as it does not inhibit the purpose of the non-aqueous photocurable composition. For example, useful substrates can be formed from materials including but are not limited to, polymeric films, metals, paperstock, rigid or flexible glasses (untreated or treated for example with tetrafluorocarbon plasma, hydrophobic fluorine, or a siloxane water-repellant material), silicon or ceramic wafers, fabrics, and combinations thereof (such as laminates of various films, or laminates of papers and films) provided that a uniform layer or pattern of a non-aqueous photocurable composition can be formed thereon in a suitable manner and followed by irradiation to form a uniform photocured layer or one or more photocured patterns on at least one receptive (supporting) surface thereof. The substrate can be transparent, translucent, or opaque, and rigid or flexible. Many useful substrates are transparent and have an integrated transmittance of at least 90%, and such transparent substrates can also be flexible such as continuous polymeric webs.

The substrate can include one or more auxiliary polymeric or non-polymeric layers or one or more patterns of other materials that are applied before a non-aqueous photocurable composition is applied. For example, either or both supporting (planar) surfaces of the substrate can be treated for example with a primer layer or electrical or mechanical treatments (such as graining) to render that surface a "receptive surface" to improve adhesion of the non-aqueous photocurable composition and resulting photocured layer or photocured pattern. An adhesive layer can be disposed on the substrate to provide various properties in response to stimuli (for example, it can be thermally activated, solvent activated, or chemically activated) and that adhesive layer can serve as a receptive layer.

In some embodiments, the substrate can comprise a separate receptive layer as a receptive surface disposed on a substrate, which receptive layer and substrate can be composed of a material such as a suitable polymeric material that is highly receptive of the non-aqueous photocurable composition. Such receptive layers can have a dry thickness of at least 0.05 μm and up to and including 10 μm, or typically of at least 0.05 μm and up to and including 3 μm, when measured at 25° C.

A supporting side of the substrate (especially polymeric substrates) can be treated by exposure to corona discharge, mechanical abrasion, flame treatments, or oxygen plasmas, or by coating with various polymeric films, such as poly(vinylidene chloride) or an aromatic polysiloxane as described for example in U.S. Pat. No. 5,492,730 (Balaba et al.) and U.S. Pat. No. 5,527,562 (Balaba et al.) and U.S. Patent Application Publication 2009/0076217 (Gommans et al.).

Suitable substrate materials for forming precursor articles as continuous webs include but are not limited to, metallic films or foils, metallic films on polymer (such as metallic films on electrically-conductive polymeric films), flexible glass, semi-conducting organic or inorganic films, organic or inorganic dielectric films, or laminates of two or more layers of such materials. For example, useful continuous web substrates can include polymeric films such as poly(ethylene terephthalate) films, poly(ethylene naphthalate) films, polyimide films, polycarbonate films, polyacrylate films, polystyrene films, polyolefin films, and polyamide films, metal foils such as aluminum foils, cellulosic papers or resin-coated or glass-coated papers, cardboard webs, and metalized polymeric films.

Particularly useful substrates are transparent polyesters films composed of poly(ethylene terephthalate), poly(ethylene naphthalate), polycarbonate, or poly(vinylidene chloride) with or without surface-treatments as noted above.

In some embodiments, a first polymer latex and second polymer latex can be mixed to form a dried primer layer on a substrate to adhere patterned materials having fine lines formed using the non-aqueous photocurable composition. The first polymer latex can comprise a first polymer and a first surfactant such that a dried coating of the first polymer latex has a surface polarity of at least 50%. The second polymer latex can comprise a second polymer and a second surfactant such that a dried coating of the second polymer latex has a surface polarity of less than or equal to 27%. Moreover, a dried coating of the mixture can have a surface polarity of at least 15% and up to and including 50%.

At least one of the first and second polymers described herein comprises a vinyl polymer comprising recurring units derived at least in part from glycidyl(meth)acrylate (meaning glycidyl acrylate, glycidyl methacrylate, or both), and in most embodiments, each of the first and second polymers is derived at least in part from glycidyl(meth)acrylate. In addition, at least one of the first polymer and second polymer is crosslinkable, and can be crosslinked for example after coating onto a suitable support such as during drying or various heat treatments of the substrate.

Particularly useful first polymers are vinyl polymers derived at least in part from one or more glycidyl-functional ethylenically unsaturated polymerizable monomers, such as glycidyl acrylate and glycidyl methacrylate. Thus, the first polymer can be a homopolymer derived from glycidyl(meth)acrylate, but more likely it is a copolymer derived from glycidyl(meth)acrylate and one or more other ethylenically unsaturated polymerizable monomers. The term "glycidyl" refers to a group comprising an oxirane ring attached to an alkyl group having 1 to 4 carbon atoms (linear or branched alkyl groups that can also be further substituted), such as methyl, ethyl, isopropyl, and t-butyl groups.

The first polymer is particularly designed by co-polymerizing one or more glycidyl(meth)acrylates with one or more alkyl(meth)acrylates wherein the ester alkyl group has at least 2 carbon atoms including but not limited to, ethyl acrylate, ethyl methacrylate, n-butyl acrylate, n-butyl methacrylate, cyclohexyl acrylate, cyclohexyl methacrylate, lauryl acrylate, lauryl methacrylate, ally methacrylate, hydroxyethyl methacrylate, hydroxyethyl acrylate, and others that would be readily apparent to one skilled in the art. Particularly useful co-monomers are the alkyl(meth)acrylates wherein the ester alkyl group has at least 4 carbon atoms, including but not limited to n-butyl acrylate, n-butyl methacrylate, n-hexyl acrylate, n-hexyl methacrylate, and cyclohexyl methacrylate.

The second polymer latex can comprise one of more second polymers and one or more second surfactants (described below) such that a dried coating of the second polymer latex has a surface polarity of less than or equal to 28% or less than or equal to 27%.

Particularly useful second polymers are vinyl polymers derived at least in part from one or more glycidyl-functional ethylenically unsaturated polymerizable monomers, such as glycidyl(meth)acrylate, for example glycidyl acrylate and glycidyl methacrylate, as described above for the first polymer. Thus, the second polymer can be a homopolymer derived from glycidyl(meth)acrylate, or a copolymer derived from glycidyl(meth)acrylate and one or more other ethylenically unsaturated polymerizable monomers. The term "glycidyl" is defined above.

The second polymer is particularly designed by co-polymerizing one or more glycidyl(meth)acrylates with one or more co-monomers such as one or more alkyl(meth)acrylates wherein the ester alkyl group has at least 2 carbon atoms including but not limited to, ethyl acrylate, ethyl methacrylate, n-butyl acrylate, n-butyl methacrylate, cyclohexyl acrylate, cyclohexyl methacrylate, lauryl acrylate, lauryl methacrylate, ally methacrylate, hydroxyethyl methacrylate, hydroxyethyl acrylate, and others that would be readily apparent to one skilled in the art. Particularly useful co-monomers are the alkyl(meth)acrylates wherein the ester alkyl group has at least 4 carbon atoms such as n-butyl acrylate, n-butyl methacrylate, n-hexyl acrylate, n-hexyl methacrylate, and cyclohexyl methacrylate.

The first polymer latex comprises one or more first surfactants, each of which is an alkyl sulfonate sodium salt wherein the alkyl group has at least 10 carbon atoms. For example, the first surfactant can be a sodium α-olefin ($C_{14}$-$C_{16}$) sulfonate, or the first surfactant can be a compound represented by $R-CH_2-CH=CH-CH_2-S(=O)_2O^-Na^+$ wherein R is a $C_{10}$, $C_{11}$, or $C_{12}$ hydrocarbon group, or mixtures of such compounds with different R groups that are any of $C_{10}$ to $C_{12}$ hydrocarbons groups. One useful commercial product containing a first surfactant is Rhodacal® A246L (available for example from Rhodia). Mixtures of such first surfactants can be used if desired.

The second polymer latex comprises one or more second surfactants, each of which is an alkyl phenol sulfate ammonium salt having at least 3 ethylene oxide units. For example, the second surfactant can be an ammonium salt of a sulfate polyethoxy nonylphenol, or the second surfactant can be represented by $R'\text{-phenyl-}(O-CH_2CH_2)_n-S(=O)O_2^-NH_4^+$ wherein R' is a $C_8$ to $C_{12}$ hydrocarbon group and n is at least 3 and up to and including 10, or more likely n is at least 3 and up to and including 6. One useful commercial product containing a second surfactant is Rhodapex® CO-436 (available for example from Rhodia). Mixtures of such second surfactants can be used if desired.

Each of the first polymer latex and the second polymer latex can be prepared using emulsion polymerization or obtained as an aqueous dispersion of particulate emulsion polymerizate.

Useful substrates can have a desired dry thickness depending upon the eventual use of the article formed therefrom. For example, the substrate dry thickness (including all treatments and auxiliary layers) can be at least 0.001 mm and up to and including 10 mm, and especially for transparent polymeric films, the substrate dry thickness can be at least 0.008 mm and up to and including 0.2 mm.

The substrate used to prepare the articles described herein can be provided in various forms, such as for example, individual sheets of any size or shape, and continuous webs such as continuous webs of transparent polymeric substrates including transparent polyester webs that are suitable for roll-to-roll operations. Such continuous polymeric webs can be divided or formed into individual first, second, and additional portions that can be used to form the same or different photocured patterns.

After application of a non-aqueous photocurable composition, any inert organic solvents of an organic diluent can be removed by a drying or pre-baking procedure that does not adversely affect the remaining components or prematurely cause photocuring. Useful drying conditions can be as low as room temperature for as little as 5 seconds and up to and including several hours depending upon the manufacturing process. In most processes, such as roll-to-roll processes described below, the drying conditions can be at high enough temperatures to remove at least 90% of the inert organic solvent(s) within at least 5 seconds.

Any applied uniform layer of the non-aqueous photocurable composition can have a dry thickness of at least 0.1 μm and up to and including 10 μm, or typically at least 0.2 μm and up to and including 1 μm, and the optimal dry thickness can be tailored for the intended use of the resulting uniform photocured layer, which generally has about the same dry thickness as a uniform layer of the non-photocured non-aqueous photocurable composition. Such a uniform layer can be applied to both (opposing) supporting sides of the substrate, which uniform layers can have the same or different chemical compositions or dry thickness.

Any applied pattern of the non-aqueous photocurable composition can comprise a grid of lines (or other shapes including circles or an irregular network) having an average dry width of at least 0.2 μm and up to and including 100 μm, or typically of at least 5 μm and up to and including 10 μm, and the optimal dry width can be tailored for the intended use of the resulting uniform photocured layer, which generally has photocured and electrically-conductive grid lines having essentially the same dimensions as the non-photocured grid lines.

Thus, the present invention can be used to provide articles comprising a substrate and uniform layers or patterns comprised of the non-aqueous photocurable composition of this invention, wherein such articles can be considered "precursor" articles, meaning that they are generally the first formed articles before photocuring. Upon photocuring the non-aqueous photocurable compositions, the precursor article is now considered an intermediate (photocured) article.

In some embodiments, the same or different non-aqueous photocurable composition can be applied in a suitable manner on both supporting sides (planar surfaces) of the substrate to form "duplex" or dual-sided precursor articles, and each applied non-aqueous photocurable composition can be in the form of the same or different uniform layer or predetermined pattern.

In many embodiments, a pattern of a non-aqueous photocurable composition is applied on one or both (opposing) supporting sides of the substrate (for example as a roll-to-roll continuous web) using a relief element such as elastomeric relief elements (flexographic printing members) derived from flexographic printing plate precursors, many of which are known in the art and some are commercially available, for example as the Cyrel® Flexographic Photopolymer Plates from DuPont and the Flexcel SR and NX Flexographic plates and Flexcel Direct Flexographic plates from Eastman Kodak Company.

Particularly useful elastomeric relief elements are derived from flexographic printing plate precursors and flexographic printing sleeve precursors, each of which can be appropriately imaged (and processed if needed) to provide the relief elements for "printing" or applying a suitable pattern.

For example, useful elastomeric relief elements can be comprised of one or more elastomeric layers, with or without a substrate, in which a relief image can be generated using suitable imaging means.

For example, an elastomeric relief element (for example, flexographic printing member) having a relief layer comprising an uppermost relief surface and an average relief image depth (pattern height) of at least 50 μm, or typically having an average relief image depth of at least 100 μm relative from the uppermost relief surface, can be prepared from imagewise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Patent Application Publication 2012/0237871 (Zwadlo), the disclosures of which are incorporated herein by reference for details of such flexographic printing member precursors. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate as described in the noted Ali et al. patent. Other useful materials and image formation methods (including development) for providing elastomeric relief images are also described in the noted Ali et al. patent. The relief layer (and flexographic printing member) can be different to provide different patterns of non-aqueous photocurable compositions to the same or opposing supporting sides of the substrate.

In other embodiments, the elastomeric relief element is provided from a direct (or ablation) laser-engraveable elastomer relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529 (Gelbart), U.S. Pat. No. 6,159,659 (Gelbart), U.S. Pat. No. 6,511,784 (Hiller et al.), U.S. Pat. No. 7,811,744 (Figov), U.S. Pat. No. 7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Patent Application Publication 2002/0136969 (Hiller et al.), U.S. Patent Application Publication 2003/0129530 (Leinenback et al.), U.S. Patent Application Publication 2003/0136285 (Telser et al.), U.S. Patent Application Publication 2003/0180636 (Kanga et al.), and U.S. Patent Application Publication 2012/0240802 (Landry-Coltrain et al.), the disclosures of all of which are incorporated herein for details of such laser-engraveable precursors. Directly engraved relief elements can be prepared without the solvent processing or development that is required for photopolymerizable elastomeric materials.

When elastomeric relief elements are used, the non-aqueous photocurable composition can applied in a suitable manner to the uppermost relief surface (raised surface) in the elastomeric relief element. Such application can be accomplished using suitable means and it is desirable that as little as possible is coated onto the sides (slopes) or recesses of the relief depressions. Anilox roller systems or other roller application systems, especially low volume Anilox rollers, below 2.5 billion cubic micrometers per square inch (6.35 billion cubic micrometers per square centimeter) and associated skive knives can be used. Optimum metering of the non-aqueous photocurable composition onto the uppermost relief surface can be achieved by controlling viscosity or thickness, or choosing an appropriate application means.

For example, the non-aqueous photocurable composition can be formulated to have a viscosity for such applications of at least 1 cps (centipoise) and up to and including 5000 cps, or at least 1 cps to and up to and including 1500 cps. The thickness of the non-aqueous photocurable composition on the relief image is generally limited to a sufficient amount that can readily be transferred to a substrate but not too much to flow over the edges of the elastomeric relief element in the recesses during application.

Thus, the non-aqueous photocurable composition can be fed from an Anilox or other roller inking system in a measured amount for each printed precursor article (either as a uniform layer or pattern). In one embodiment, a first roller can be used to transfer the non-aqueous photocurable composition from an "ink" pan or a metering system to a meter roller or Anilox roller. The non-aqueous photocurable composition is generally metered to a uniform thickness when it is transferred from the Anilox roller to a printing plate cylinder. When the substrate as a continuous web is moved through the roll-to-roll handling system from the printing plate cylinder to an impression cylinder, the impression cylinder applies pressure to the printing plate cylinder that transfers an image of non-aqueous photocurable composition from an elastomeric relief element to the substrate.

After the non-aqueous photocurable composition has been applied to the uppermost relief surface (or raised surface) of the elastomeric relief element, it can be useful to remove at least 25 weight % of any inert organic solvent(s) to form a more viscous deposit on the uppermost relief surface of the relief image. This removal of inert organic solvents can be achieved in any manner, for example using jets of hot air, evaporation at room temperature, or heating in an oven at an elevated temperature, or other means known in the art for removing a solvent.

Once on the substrate, either in a uniform layer or predetermined pattern of grid lines or other shapes (on one or both supporting sides of the substrate), the non-aqueous photocurable composition in the precursor article can be irradiated with suitable radiation as described above from a suitable source such as a fluorescent lamp or LED to provide a photocured layer or one or more photocured patterns on the substrate. For example, photocuring can be achieved by the use of UV-visible irradiation having a wavelength ($\lambda_{max}$) of at least 190 nm and up to and including 700 nm and at intensity of at least 1,000 microwatts/cm$^2$ and up to and including 80,000 microwatts/cm$^2$. The irradiation system used to generate such radiation can consist of one or more ultraviolet lamps for example in the form of 1 to 50 discharge lamps, for example, xenon, metallic halide, metallic arc (such as a low, medium or high pressure mercury vapor discharge lamps having the desired operating pressure from a few millimeters to about 10 atmospheres). The lamps can include envelopes capable of transmitting light of a wavelength of at least 190 nm and up to and including 700 nm or typically at least 240 nm and up to and including 450 nm. The lamp envelope can consist of quartz, such as spectrocil or Pyrex. Typical lamps that can be employed for providing ultraviolet radiation are, for example, medium pressure mercury arcs, such as the GE H3T7 arc and a Hanovia 450 W arc lamp. Photocuring can be carried out using a combination of various lamps, some of or all of which can operate in an inert atmosphere. When using UV lamps, the irradiation flux impinging upon the substrate (or applied layer or pattern) can be designed to be sufficient to effect sufficient rapid photocuring of the applied non-aqueous photocurable composition within 1 to 20 seconds in a continuous manner, for example in a roll-to-roll operation.

An LED irradiation device to be used in for photocuring can have an emission peak wavelength of 350 nm or more. The LED device can include two or more types of elements having different emission peak wavelengths greater than or equal to 350 nm. A commercial example of an LED device that has an emission peak wavelength of 350 nm or more and has an ultraviolet light-emitting diode (UV-LED), is NCCU-033 that is available from Nichia Corporation.

The result of such irradiation of a precursor article is an intermediate article comprising the substrate (for example, individual sheets or a continuous web) and having thereon either a photocured layer or one or more photocured patterns derived from the non-aqueous photocurable composition on one or both supporting sides of the substrate.

The resulting intermediate articles can be used in this form for some applications, but in most embodiments, they are further processed to incorporate an electrically-conductive metal on the uniform photocured layer or photocured pattern(s), each of which includes the carbon-coated metal particles as "seed" materials for further application of electrically-conductive metals, for example using electroless metal plating procedures. For example, the electroless "seed" carbon-coated metal particles as described above can include silver, palladium, or platinum particles that can be electrolessly plated with copper, platinum, palladium, or other metals as described below.

One useful method uses multiple flexographic printing plates (for example, prepared as described above) in a stack in a printing station wherein each stack has its own printing plate cylinder so that each flexographic printing plate is used to print individual substrates, or the stack of printing plates can be used to print multiple portions in a continuous polymeric web (on one or both supporting sides). The same or different non-aqueous photocurable composition can be "printed" or applied to such a substrate (on same or opposing supporting sides) using the multiple flexographic printing plates.

In other embodiments, a central impression cylinder can be used with a single impression cylinder mounted on a printing press frame. As the substrate (or receiver element) enters the printing press frame, it is brought into contact with the impression cylinder and the appropriate pattern is printed with the non-aqueous photocurable composition. Alternatively, an in-line flexographic printing process can be utilized in which the printing stations are arranged in a horizontal line and are driven by a common line shaft. The printing stations can be coupled to exposure stations, cutting stations, folders, and other post-processing equipment. A skilled worker could readily determine other useful configurations of equipment and stations using information that is available in the art. For example, an in-the-round imaging process is described in WO 2013/063084 (Jin et al.).

Intermediate articles described herein having the described photocured patterns containing dispersed carbon-coated metal particles can be immediately immersed in an aqueous-based electroless metal plating bath or solution, or the intermediate articles (for example as rolled up continuous webs) can be stored with just the photocured pattern(s) for use at a later time.

For example, each intermediate article can be contacted with an electroless plating metal that is the same as or different from the metal within the carbon-coated metal particles incorporated within the photocured pattern(s). In most embodiments, however, the electroless plating metal is a different metal from the metal used in the carbon-coated metal particles dispersed within the photocured pattern(s).

Any metal that will likely electrolessly "plate" on the carbon-coated metal particles can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals for carbon-coated silver, copper, or palladium particles.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that can contain formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure to provide an electrically-conductive metal pattern on one or more portions of one or opposing supporting sides of the substrate, the resulting product article can be removed from the aqueous-based electroless plating bath or solution and can be washed using distilled water or deionized water or another aqueous-based solution to remove any residual electroless plating chemistry. At this point, the electrolessly plated metal is generally stable and can be used for their intended purpose to form various electrically-conductive articles with desired electrically-conductive metal grid lines or electrically-conductive metal connector (or BUS connectors or electrodes).

In some embodiments, the resulting product article can be rinsed or cleaned with water at room temperature as described for example in [0048] of US 2014/0071356 (Petcavich), or with deionized water at a temperature of less than 70° C. as described in [0027] of WO 2013/169345 (Ramakrishnan et al.).

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with another seed metal catalyst in an aqueous-based seed metal catalyst solution to facilitate deposition of additional metals.

In addition, multiple treatments with an aqueous-based electroless metal plating solution can be carried out in sequence, using the same or different conditions. Sequential washing or rinsing steps can be also carried out where appropriate at room temperature or a temperature less than 70° C.

Further, the electroless plating procedures can be carried out multiple times, in sequence, using the same or different electroless plating metal and the same or different electroless plating conditions.

Some details of useful methods and apparatus for carrying out some embodiments of the present invention are described for example in US 2014/0071356 (noted above) and WO 2013/169345 (noted above). Other details of a useful manufacturing system for preparing conductive articles especially in a roll-to-roll manner are provided in PCT/US/062366 (filed Oct. 29, 2012 by Petcavich and Jin), the disclosure of which is incorporated herein by reference.

An additional system of equipment and step features that can be used in carrying out the present invention is described in U.S. Ser. No. 14/146,867 (filed Jan. 3, 2014 by Shifley), the disclosure of which is incorporated herein by reference for any details that are pertinent to use of the present invention.

The non-aqueous photocurable compositions of this invention can be used in a method to provide one or more electrically conductive articles. This method comprises providing a continuous web of a transparent substrate [examples of which are described above, and can be particularly continuous webs of poly(ethylene terephthalate)].

On at least a first portion of the continuous web of a transparent substrate, the method also includes forming a photocurable pattern of a non-aqueous photocurable composition (as described herein) that comprises a photocurable component and dispersed carbon-coated metal particles as described above. The photocurable pattern is then photocured to form a photocured pattern on the first portion of the continuous web, which photocured pattern comprises the dispersed carbon-coated metal particles (described above) as seed metal catalyst sites. Such photocured pattern can then be electrolessly plated on the first portion of the continuous web with an electrically conductive metal (as described above).

This method can further comprise:
  carrying out the forming, photocuring, and electrolessly plating features described above one or more additional times on one or more additional portions of the continuous web that are different from the first portion, using the same or different non-aqueous photocurable composition. In such manner, multiple photocured and electrolessly plated patterns can be formed on the same or different supporting sides of the substrate. The resulting electrically-conductive patterns can be the same in composition, pattern, or electrical-conductivity, or they can be all different (as predetermined from customer needs) in any or all of these features.

Thus, the method can be used to provide a plurality of precursor articles, comprising:
  forming a first photocurable pattern on a first portion of the continuous web by applying a non-aqueous photocurable composition to the first portion using a flexographic printing member,
  advancing the continuous web comprising the first photocurable pattern to be proximate exposing radiation, and thereby forming a first photocured pattern on the first portion,
  forming a second photocurable pattern on a second portion of the continuous web by applying the same or different non-aqueous photocurable composition to the second portion using the flexographic printing member,
  advancing the continuous web comprising the second photocurable pattern to be proximate exposing radiation, and thereby forming a second photocured pattern on the second portion,
  optionally, forming one or more additional photocured patterns in a similar manner on one or more additional respective portions of the continuous web using the same or different non-aqueous photocurable composition and the same or different flexographic printing member, and
  winding up the continuous web comprising multiple photocured patterns, or using the continuous web immediately for further processing such as electrolessly plating.

Thus, the method can further comprise:
  forming multiple electrically conductive articles from the continuous web comprising multiple photocured patterns, and assembling the individual electrically conductive articles into the same or different individual devices (such as the same or different touch screen displays or devices).

Such method can also comprise:

electrolessly plating each of the multiple photocured patterns in the continuous web to form multiple electrically-conductive articles, which can be assembled into the same or different individual devices by the same or different user. Such devices can be touch screen or other display devices that also include suitable controllers, housings, and software for any type of desired communication via the internet. Alternatively, the devices can be sub-components of such touch screen or other display devices.

In some embodiments, the method can be used for preparing a device comprising a touch screen, the method comprising:

assembling one or more individually electrically-conductive articles into a device housing to form a touch screen area, each of the one or more individually electrically-conductive articles comprising an electrically-conductive pattern comprising an electrically-conductive metal that has been electrolessly plated onto a photocured pattern derived from a non-aqueous photocurable composition of the present invention.

Useful product articles prepared according using the present invention can be formulated into capacitive touch screen sensors that comprise suitable patterns of electrically-conductive metal grid lines, electrically-conductive metal connectors (electrical leads or BUS connectors). For example, the patterns of electrically-conductive metal grid lines and electrically-conductive metal connectors can be formed by printing the non-aqueous photocurable composition of this invention as predetermined patterns, followed by electrolessly plating the printed patterns with suitable metals as described above.

The present invention provides at least the following embodiments and combinations thereof, but other combinations of features are considered to be within the present invention as a skilled artisan would appreciate from the teaching of this disclosure:

1. A non-aqueous composition comprising dispersed carbon-coated metal particles in an organic diluent in an amount of at least 10 weight % based on the total weight of the non-aqueous composition, the dispersed carbon-coated metal particles having a median diameter equal to or less than 0.6 μm, and being dispersed with a particle dispersing agent that has a weight average molecular weight ($M_w$) of at least 2,000 and up to and including 100,000 and comprises nitrogen-containing units, the median diameter being determined using a dynamic light scattering method, wherein, when the non-aqueous composition contains up to and including 25 weight % of the dispersed carbon-coated metal particles, it exhibits no visual settling when subjected to a settling test of at least 24 hours at 20° C.

2. A non-aqueous photocurable composition comprising:

dispersed carbon-coated metal particles in an amount of at least 10 weight % based on the total weight of the non-aqueous photocurable composition, and the dispersed carbon-coated metal particles having a median diameter equal to or less than 0.6 μm, and being dispersed with a particle dispersing agent that has a weight average molecular weight ($M_w$ of at least 2,000 and up to and including 100,000 and comprises nitrogen-containing units, the median diameter being determined using a dynamic light scattering method, an organic diluent, a UV-curable component, and if needed, a UV photoinitiator, wherein, when the non-aqueous photocurable composition contains up to and including 25 weight % of the dispersed carbon-coated metal particles, it exhibits no visual settling when subjected to a settling test of at least 24 hours at 20° C.

3. The non-aqueous photocurable composition of embodiment 2, wherein the UV-curable component is an acid-catalyzed photocurable component and the non-aqueous photocurable composition further comprises a photoacid generator.

4. The non-aqueous photocurable composition of embodiment 2, wherein the UV-curable component is a free radically photocurable component, and the non-aqueous photocurable composition further comprises a free radical photoinitiator.

5. The non-aqueous composition or non-aqueous photocurable composition of any of embodiments 1 to 4, comprising dispersed carbon-coated silver particles or dispersed carbon-coated copper particles, or a mixture of both dispersed carbon-coated silver particles and dispersed carbon-coated copper particles.

6. The non-aqueous composition or non-aqueous photocurable composition of any of embodiments 1 to 5, wherein the weight ratio of the particle dispersing agent to the dispersed carbon-coated metal particles is at least 1:100 and up to and including 30:100.

7. The non-aqueous composition or non-aqueous photocurable composition of any of embodiments 1 to 6, wherein the dispersed carbon-coated metal particles are present in an amount of at least 15 weight % and up to and including 70 weight %, based on the total weight of the non-aqueous composition.

8. The non-aqueous composition or non-aqueous photocurable composition of any of embodiments 1 to 7, wherein the particle dispersing agent has an $M_w$ of at least 2,000 and up to and including 50,000.

9. The non-aqueous composition or non-aqueous photocurable composition of any of embodiments 1 to 8, further comprising dispersed carbon black in an amount of up to and including 20 weight %, based on the total weight of the non-aqueous composition.

10. The non-aqueous composition or non-aqueous photocurable composition of any of embodiments 1 to 9, wherein the particle dispersing agent is an organic polymer comprising ester units.

11. The non-aqueous composition or non-aqueous photocurable composition of any of embodiments 1 to 10, wherein the particle dispersing agent is an organic polymer that comprises units chosen from at least one of the following classes (i) through (iv):

(i) pyridine units;

(ii) imine units;

(iii) imide units; and (iv) amine units.

12. The non-aqueous composition or non-aqueous photocurable composition of any of embodiments 1 to 11, wherein the dispersed carbon-coated metal particles are dispersed carbon-coated silver particles that are present at a concentration is at least 15 weight % and up to and including 60 weight % based on the total weight of the non-aqueous composition, and the dispersed carbon-coated silver particles have a median diameter of less than 0.5 μm as determined using a dynamic light scattering method.

13. The non-aqueous composition or non-aqueous photocurable composition of any of embodiments 1 to 12, wherein the organic diluent is an organic solvent medium that comprises at least one of 2-ethoxyethanol, 2-(2-methoxyethoxy) ethanol, 2-(2-ethoxyethoxy)ethanol, 1-methoxy-2-propanol, 4-heptanone, 3-heptanone, 2-heptanone, cyclopentanone, cyclohexanone, diethyl carbonate, 2-ethoxyethyl acetate, N-butyl butyrate, and methyl lactate.

14. The non-aqueous photocurable composition of any of embodiments 2 to 13, wherein the organic diluent comprises at least one UV-curable component.

The following Examples are provided to illustrate the practice of this invention and are not meant to be limiting in any manner.

The following Dispersant Screening Test was used to determine useful particle dispersing agents for dispersing carbon-coated silver particles in the practice of the present invention. This test could be similarly used to determine useful particle dispersing agents to suitably disperse other carbon-coated metal particles such as carbon-coated copper particles and carbon-coated platinum particles.

Initial Dispersant Screening Test (0.5 weight % Carbon-Coated Silver Particles):

This test was carried out using carbon-coated silver particles using a small quantity of carbon-coated silver particles and an excess of tested particle dispersing agent ("dispersant") (ratio of 10:1 of the weight of particle dispersing agent to the weight of carbon-coated silver particles). A solution of 5 weight % tested dispersant was prepared by adding 2.5 g of the desired dispersant to 47.5 g of 1-methoxy-2-propanol (Sigma-Aldrich) with stirring until the dispersant was completely dissolved to form a dispersant solution. Then, 0.02 g of carbon-coated silver particles (NovaCentrix, Ag-25-ST3, 25 nm specified average particle diameter, Austin Tex.) was added to 4 g of the 5 weight % of the dispersant solution in a 20 ml glass vial with stirring. The resulting non-aqueous composition was each treated with an ultrasonic probe system (Vibra-Cell VC600, Sonics & Materials, Inc.) for 2 minutes at ambient temperature and was then visually evaluated for settling. This was done by visual observation after allowing the suspension to stand undisturbed for 24 hours at room temperature (20° C.). The following rating scale was used to evaluate the settling of the dispersed carbon-coated silver particles:

5=clear solution with complete settling;
4=pale gray solution with nearly complete settling;
3=broad gray band above the black-colored suspension with partial settling;
2=narrow gray band above the black-colored suspension with some partial setting but less than a "3" rating; and
1=no apparent settling of the black-colored suspension.

The results of the Dispersant Screening Test are summarized below in TABLE I.

TABLE I

| Test | Dispersant | Commercial Source | Nitrogen Functional Group | Approx. $M_w$ (Daltons)* | Settling Rating |
|---|---|---|---|---|---|
| 1-1 | Byk ®-9077 | BYK | amine | 20,300 | 1 |
| 1-2 | Disperbyk ®-2013 | BYK | amine | 2,700 | 1 |
| 1-3 | Disperbyk ®-2118 | BYK | amine | 8,000 | 1 |
| 1-4 | Efka ® PX 4701 | BASF | amine | 28,200 | 1 |
| 1-5 | Solsperse ® 39000 | Lubrizol | imine | 28,000 | 1 |
| 1-6 | Solsperse ® 35000 | Lubrizol | imine | 30,500 | 1 |
| 1-7 | Efka ® PX 4731 | BASF | amine | 20,900 | 1 |
| 1-8 | Efka ® PX 4732 | BASF | amine | 50,400 | 1 |
| 1-9 | Disperbyk ®-2152 | BYK | amine | 12,000 | 1 |
| 1-10 | Disperbyk ®-2155 | BYK | amine | 12,900 | 1 |
| 1-11 | Solsperse ® 28000 | Lubrizol | amine | >5,000 | 1 |
| 1-12 | Luviskol ® K30 PVP | BASF | amide | 50,000 | 1 |
| 1-13 | Disperbyk ®-108 | BYK | amine | Unknown | 1 |
| 1-14 | Disperbyk ®-191 | BYK | amine | Unknown | 1 |
| 1-15 | Triton ® X-15 | Dow | none | 272 | 2 |
| 1-16 | Triton ® X-100 | Dow | none | 624 | 2 |
| 1-17 | Tetronic ® 150 R1 | BASF | amine | 8,000 | 2 |
| 1-18 | Zephrym ® PD 2234 | Croda | unknown | 3,500 | 2 |
| 1-19 | Solsperse ® 71000 | Lubrizol | amine | 29,700 | 2 |
| 1-20 | Poly(2-ethyl-2-oxazoline) | Sigma-Aldrich | oxazoline | 200,000 | 2 |
| 1-21 | Solsperse ® 54000 | Lubrizol | unknown | unknown | 2 |
| 1-22 | Oleic Acid | Sigma-Aldrich | none | 282 | 3 |
| 1-23 | Solsperse ® 20000 | Lubrizol | amine | 3,800 | 3 |
| 1-24 | Solsperse ® 41000 | Lubrizol | none | unknown | 3 |
| 1-25 | Triton ® X-45 | Dow | none | 404 | 4 |
| 1-26 | Disperbyk ®-116 | BYK | amine | unknown | 4 |
| 1-27 | Oleylamine | Sigma-Aldrich | amine | 267 | 4 |
| 1-28 | Disperbyk ®-2117 | BYK | amine | 8,100 | 4 |
| 1-29 | Diethanolamine | Sigma-Aldrich | amine | 105 | 5 |
| 1-30 | SMA ® 17352P | Cray Valley | none | 7,000 | 5 |
| 1-31 | SMA ® 1440F | Cray Valley | none | 7,000 | 5 |
| 1-32 | Efka ® PX 6220 | BASF | amine | unknown | 5 |
| 1-33 | Zetasperse ® 2100 | Air Products | amine | unknown | 5 |
| 1-34 | SMA ® 2625 | Cray Valley | none | 9,000 | 5 |
| 1-35 | Disperbyk ®-192 | BYK | unknown | unknown | 5 |
| 1-36 | Tetronic ® 701 | BASF | amine | 3,600 | 5 |
| 1-37 | Solsperse ® 16000 | Lubrizol | amine | 2,800 | 5 |
| 1-38 | Zephrym ® PD 3315 | Croda | unknown | unknown | 5 |
| 1-39 | Solsperse ® 17000 | Lubrizol | amine | <3,000 | 5 |
| 1-40 | None | | | | 2 |
| 1-41 | None | | | | 5 |

*Weight averaged molecular weight, reported by manufacturer or measured by Size Exclusion Chromatography
SMA ® = styrene-maleic anhydride copolymer
PVP = poly(vinyl pyrrolidone)

The dispersants that provided a settling rating of 3 or lower in TABLE I were then selected for a further round of testing, but at higher concentrations of carbon-coated silver particles, in a Concentrated Dispersant Test as follows.

Concentrated Dispersant Test (50 weight % Carbon-Coated Silver Particles):

This evaluation was designed to evaluate the dispersants in a more concentrated formulation with a much lower dispersant to carbon-coated silver particle weight ratio (4 or 5 weight % dispersant to weight % carbon-coated silver particles). They were only characterized for median particle size because they were too concentrated to visually assess the settling behavior. The particle size distribution derived from light scattering measurements provides a good indication of the efficacy of a particle dispersing agent (dispersant) by showing the extent of large agglomerates in suspension in the non-aqueous compositions.

A solution of 5 weight % tested dispersant was prepared by adding 2.5 g of the desired dispersant to 47.5 g of 1-methoxy-2-propanol with stirring until the dispersant was completely dissolved to provide a dispersant solution. Then, 8 g of carbon-coated silver particles (NovaCentrix Ag-25-ST3, 25 nm specified average particle diameter, Austin Tex.) was added to 8 g of the 5 weight % dispersant solution in a 60 ml bottle (LDPE from Nalgene) with stirring. The resulting non-aqueous composition was treated with an ultrasonic probe system (Vibra-Cell VC600, Sonics& Materials, Inc.) for 2 to 4 minutes at ambient temperature (20° C.). About 0.2 g of the suspension was removed and the median particle diameter was measured using by dynamic light scattering using a Malvern Zetasizer Nano-ZS ("ZEN") apparatus and expressed as Dv (50%). All size data are based on volume weighted distributions and the equivalent spherical diameter model. The results are shown below in TABLE II.

TABLE II

| Test | Weight % Dispersant | Dispersant | "ZEN" Dv (50%) (μm) |
|---|---|---|---|
| 2-1 | 0 | None | >3, TLTM* |
| 2-2 | 4 | Disperbyk ®-2013 | 0.019 |
| 2-3 | 4 | Disperbyk ®-2155 | 0.019 |
| 2-4 | 4 | Byk ® 9077 | 0.024 |
| 2-5 | 4 | Disperbyk ®-2118 | 0.026 |
| 2-6 | 4 | Disperbyk ®-2152 | 0.240 |
| 2-7 | 5 | Disperbyk ®-2013 | 0.016 |
| 2-8 | 5 | Efka ® PX 4701 | 0.019 |
| 2-9 | 5 | Byk ® 9077 | 0.021 |
| 2-10 | 5 | Tetronic ® 150R1 | 0.021 |
| 2-11 | 5 | Efka ® PX 4701 | 0.023 |
| 2-12 | 5 | Efka ® PX 4731 | 0.024 |
| 2-13 | 5 | Efka ® PX 4732 | 0.027 |
| 2-14 | 5 | Solsperse ® 39000 | 0.032 |
| 2-15 | 5 | Luviskol ® K-30 PVP | 0.034 |
| 2-16 | 5 | Disperbyk ®-2155 | 0.036 |
| 2-17 | 5 | Solsperse ® 35000 | 0.133 |
| 2-18 | 5 | Triton ® X-100 | >3, TLTM* |
| 2-19 | 5 | Disperbyk ®-108 | >3, TLTM* |
| 2-20 | 5 | Diethanolamine | >3, TLTM* |
| 2-21 | 5 | Oleic acid | >3, TLTM* |
| 2-22 | 5 | Triton ® X-15 | >3, TLTM* |
| 2-23 | 5 | Solsperse ® 54000 | >3, TLTM* |
| 2-24 | 5 | Disperbyk ®-191 | >3, TLTM* |
| 2-25 | 5 | Solsperse ® 28000 | >3, TLTM* |
| 2-26 | 5 | Poly(2-ethyl-2-oxazoline) | >3, TLTM* |

*TLTM = "too large to measure" using the "ZEN" apparatus

The results shown in TABLE II illustrate that the evaluated dispersants identified as Tests 2-2 through 2-17 effectively dispersed the carbon-coated silver particles having desirably small median diameters (equal to or less than 0.6 μm) and are thus embodiments of the non-aqueous compositions of the present invention.

Non-Aqueous Photocurable Compositions (21 weight % Dispersed Carbon-Coated Silver Particles):

Non-aqueous photocurable compositions were formulated using each of the particle dispersing agents (dispersants) shown below in TABLE III and dispersed carbon-coated silver particles, and each of these non-aqueous photocurable compositions was used to prepare electrically-conductive articles.

A solution of 5 weight % of the desired dispersant was prepared by adding 2.5 g of the dispersant to 47.5 g of 1-methoxy-2-propanol with stirring until the dispersant was completely dissolved to form a dispersant solution. Then, 8 g of carbon-coated silver particles (NovaCentrix Ag-25-ST3, 25 nm specified average particle diameter, Austin Tex.) were added to 8 g of the 5 weight % dispersant solution in a 60 ml bottle (LDPE from Nalgene) with stirring. The resulting non-aqueous composition was treated with an ultrasonic probe system (Vibra-Cell VC600, Sonics & Materials, Inc.) for 4 minutes at ambient temperature (20° C.).

A solution of photocurable components was prepared by mixing: 27.33 weight % of epoxy acrylates CN 153 (6.02 g, Sartomer), 18.82 weight % of poly(ethylene glycol) diacrylate (4.15 g, $M_n$ of 250, Sigma-Aldrich), 4.04 weight % of poly(ethylene glycol) diacrylate (0.89 g, $M_n$ of 575, Sigma-Aldrich), 20.62 weight % of pentaerythritol tetraacrylate (4.55 g, Sartomer), 1.52 weight % of a triaryl sulfonium salt hexafluorophosphate mixed in 50% propylene carbonate (0.34 g, Sigma-Aldrich), 1.52 weight % a triaryl sulfonium salt hexafluoro-antimonate mixed in 50% propylene carbonate (0.34 g, Sigma-Aldrich), 4.55 weight % of free radical photoinitiator hydroxycyclohexyl phenyl ketone (1.0 g, Sigma-Aldrich), 2.32 weight % of free radical photoinitiator methyl-4'-(methylthio)-2-morpholinopropiophenone (0.51 g, Sigma-Aldrich), 0.002 weight % 9-fluorenone (0.0004 g, Sigma-Aldrich), 3.81 weight % ethyl-4-(dimethylamino) benzoate (0.84 g, Sigma-Aldrich), and 15.42 weight % 1-methoxy-2-propanol (3.4 g, Sigma-Aldrich).

A sample (22.04 g) of this solution of photocurable components was added to the non-aqueous composition containing carbon-coated silver particles (16 g) with stirring. Each of the non-aqueous photocurable compositions was then subjected to mixing using a PRO 300D benchtop homogenizer with a rotor-stator probe (PRO Scientific, Inc.) operated at 10,000 rpm for 5 minutes, with cooling of the non-aqueous photocurable composition.

About 0.2 g of the suspension was removed and the median particle diameter was measured using by dynamic light scattering using a Malvern Zetasizer Nano-ZS ("ZEN") apparatus and expressed as Dv (50%). All size data are based on volume weighted distributions and the equivalent spherical diameter model. The results are shown below in TABLE III.

About a 2 g sample of the non-aqueous photocurable composition (also considered an "ink") was withdrawn and placed in a narrow glass vial to evaluate settling and clarification after 24 hours and throughout about 7 days. A clear band of colorless fluid at the top of the resulting black-colored non-aqueous photocurable composition after 24 hours indicated a failure to keep the carbon-coated silver particles suspended. The presence of sediment in the bottom of the vial without clarification indicated a partially stabilized suspension of the carbon-coated silver particles. The results of these evaluations are shown below in TABLE III.

TABLE III

| Non-aqueous Photocurable Composition | Weight % of Dispersant | Dispersant | "ZEN" Dv (50%) (μm) | Settling Evaluation |
|---|---|---|---|---|
| 3-1 (Inv)* | 5 | Efka ® PX 4701 | 0.020 | None |
| 3-2 (Inv) | 5 | Byk ® 9077 | 0.022 | None |
| 3-3 (Inv) | 5 | Disperbyk ®-2155 | 0.026 | None |
| 3-4 (Inv) | 5 | Efka ® PX 4732 | 0.045 | None |
| 3-5 (Inv) | 5 | Disperbyk ®-2013 | 0.208 | None |
| 3-6 (Inv) | 5 | Solsperse ® 39000 | 0.558 | None |
| 3-7 (Inv) | 5 | Efka ® PX 4731 | 0.552 | None |
| 3-8 (Inv) | 5 | Solsperse ® 35000 | 0.545 | None |
| 3-9 (Comp)** | 5 | Luviskol ® K-30 PVP | 0.700 | Sediment observed |
| 3-10 (Comp) | 5 | Poly(2-ethyl-2-oxazoline) | 0.046 | Sediment observed |
| 3-11 (Comp) | 6 | Disperbyk ®-2152 | 0.801 | Yes |
| 3-12 (Comp) | 0 | None | >3, TLTM | Yes |
| 3-13 (Comp) | 5 | Solsperse ® 28000 | >3, TLTM | Yes |
| 3-14 (Comp) | 5 | Triton ® X-100 | >3, TLTM | Yes |
| 3-15 (Comp) | 5 | Solsperse ® 54000 | >3, TLTM | Yes |
| 3-16 (Comp) | 5 | Triton ® X-15 | >3, TLTM | Yes |
| 3-17 (Comp) | 5 | Oleic acid | >3, TLTM | Yes |
| 3-18 (Comp) | 5 | Disperbyk ®-191 | >3, TLTM | Yes |
| 3-19 (Comp) | 5 | Diethanolamine | >3, TLTM | Yes |
| 3-20 (Comp) | 5 | Disperbyk ®-108 | >3, TLTM | Yes |

TLTM = too large to measure
PVP = poly(vinyl pyrrolidone)
*Inv = Invention non-aqueous photocurable composition
**Comp = Comparative non-aqueous photocurable composition The results shown in TABLE III illustrate that only the particle dispersing agents (dispersants) defined for the present invention provided suitably small median diameters for the dispersed carbon-coated silver particles in the non-aqueous photocurable compositions. Moreover, the inventive non-aqueous photocurable compositions exhibited no settling or sediment during formulation and use.

ARTICLE INVENTION EXAMPLE

Use of Non-Aqueous Photocurable Composition to Provide Patterned Article

This Invention Example demonstrates the use of a non-aqueous photocurable composition of the present invention to prepare a precursor article having a photocurable pattern on a suitable substrate.

A flexographic printing member was used for printing invention non-aqueous photocurable compositions (described below), which was a sample of commercially available Kodak Flexcel NX flexographic printing plate precursor (Eastman Kodak Company) that had been imaged using a mask that had a predetermined pattern written using the Kodak Square Spot laser technology at a resolution of 12,800 dpi. The flexographic printing plate precursor was UV exposed and processed (developed) using known conditions suggested for these flexographic printing members by the manufacturer. The resulting flexographic printing plate was 1.14 mm thick (including the PET film). The backing tape used to mount the flexographic plate to a printing form cylinder was 1120 Beige tape (3M Company) that was 20 mil (0.051 cm) thick with a Shore A of 55. The resulting relief image design in the flexographic printing member included a grid pattern with fine lines that had a width at the top relief surface of 7 μm.

The invention non-aqueous photocurable composition 3-1 (Inv) described in TABLE III above was printed onto a PET [poly(ethylene terephthalate) film [Melinex® ST505, DuPont Teijin Films] substrate using the described patterned flexographic printing member (described below) using a benchtop test printer, "IGT F1 Printability Tester" (IGT Testing Systems inc., Arlington Heights, Ill.) in the flexographic mode. An Anilox roller system that was used to apply the non-aqueous photocurable composition to the flexographic printing member had values of 1.3 BCMI and 1803 1pi, as specified by IGT Testing Systems. The printed patterns were made at ambient temperature using an Anilox force of 20N, a print force of 10N, and a print speed of 0.20 m/s. The printed average line widths on the substrate were obtained from the patterns printed with the noted grid pattern on the flexographic printing member.

The result of these operations was an article comprising printed patterns of the non-aqueous photocurable composition on the PET substrate.

Each printed pattern of non-aqueous photocurable composition was irradiated with UV radiation using a Fusion 300 WPI medium pressure mercury lamp providing irradiation wavelengths between 190-1500 nm, with an approximate exposure of 298 mJ/cm$^2$ to photocure each printed pattern. The printed and photocured average line widths of the cured patterns were measured in both transmission and reflection mode using an Olympus BH-2 optical microscope.

This working example demonstrates that the non-aqueous photocurable compositions can be successfully used to provide precursor articles with non-photocured patterns on a suitable substrate, which in turn can be used to provide intermediate articles with photocured patterns.

INVENTION EXAMPLE

Use of Non-Aqueous Photocurable Composition to Provide Electrically-Conductive Article The article described above containing the photocured patterns can be used as an intermediate article for further operation. In particular, the intermediate article was subjected to electroless copper plating by immersing it for 10 minutes at 35° C. in a beaker containing Enplate® Cu-406 electroless plating solution (Enthone), followed by rinsing with distilled water and drying with nitrogen, to form product articles with electrically-conductive patterns disposed on the PET substrates.

The invention has been described in detail with particular reference to certain preferred embodiments thereof, but it will be understood that variations and modifications can be effected within the spirit and scope of the invention.

The invention claimed is:

1. A non-aqueous composition comprising dispersed carbon-coated non-magnetic metal particles in an organic diluent in an amount of at least 10 weight % based on the total weight of the non-aqueous composition, the dispersed carbon-coated non-magnetic metal particles having a median diameter equal to or less than 0.6 μm, and being dispersed with a particle dispersing agent that has a weight average molecular weight ($M_w$) of at least 2,000 and up to and including 100,000 and comprises nitrogen-containing units, the median diameter being determined using a dynamic light scattering method, wherein, when the non-aqueous composition contains up to and including 25 weight % of the dispersed carbon-coated non-magnetic metal particles, it exhibits no visual settling when subjected to a settling test of at least 24 hours at 20° C.

2. The non-aqueous composition of claim 1, wherein the dispersed carbon-coated non-magnetic metal particles are dispersed carbon-coated silver particles or dispersed carbon-coated copper particles, or a mixture of both dispersed carbon-coated silver particles and dispersed carbon-coated copper particles.

3. The non-aqueous composition of claim 1, wherein the weight ratio of the particle dispersing agent to the dispersed carbon-coated non-magnetic metal particles is at least 1:100 and up to and including 30:100.

4. The non-aqueous composition of claim 1, wherein the dispersed carbon-coated non-magnetic metal particles are present in an amount of at least 15 weight % and up to and including 70 weight %, based on the total weight of the non-aqueous composition.

5. The non-aqueous composition of claim 1, wherein the particle dispersing agent has an $M_w$ of at least 2,000 and up to and including 50,000.

6. The non-aqueous composition of claim 1, further comprising dispersed carbon black in an amount of up to and including 20 weight %, based on the total weight of the non-aqueous composition.

7. The non-aqueous composition of claim 1, wherein the particle dispersing agent is an organic polymer comprising ester units.

8. The non-aqueous composition of claim 1, wherein the particle dispersing agent is an organic polymer that comprises units chosen from at least one of the following classes (i) through (iv):
   (i) pyridine units;
   (ii) imine units;
   (iii) imide units; and
   (iv) amine units.

9. The non-aqueous composition of claim 1, wherein the dispersed carbon-coated non-magnetic metal particles are dispersed carbon-coated silver particles that are present at a concentration is at least 15 weight % and up to and including 60 weight % based on the total weight of the non-aqueous composition, and the dispersed carbon-coated silver particles have a median diameter of less than 0.5 μm as determined using a dynamic light scattering method.

10. The non-aqueous composition of claim 1 further comprising a photocurable component.

11. The non-aqueous composition of claim 1, wherein the organic diluent is an organic solvent medium that comprises at least one of 2-ethoxyethanol, 2-(2-methoxyethoxy)ethanol, 2-(2-ethoxyethoxy)ethanol, 1-methoxy-2-propanol, 4-heptanone, 3-heptanone, 2-heptanone, cyclopentanone, cyclohexanone, diethyl carbonate, 2-ethoxyethyl acetate, N-butyl butyrate, and methyl lactate.

12. A non-aqueous photocurable composition comprising:
   dispersed carbon-coated non-magnetic metal particles in an amount of at least 10 weight % based on the total weight of the non-aqueous photocurable composition, and the dispersed carbon-coated non-magnetic metal particles having a median diameter equal to or less than 0.6 μm, and being dispersed with a particle dispersing agent that has a weight average molecular weight ($M_W$) of at least 2,000 and up to and including 100,000 and comprises nitrogen-containing units, the median diameter being determined using a dynamic light scattering method,
   an organic diluent,
   a UV-curable component, and
   if needed, a UV photoinitiator,
   wherein, when the non-aqueous photocurable composition contains up to and including 25 weight % of the dispersed carbon-coated non-magnetic metal particles, it exhibits no visual settling when subjected to a settling test of at least 24 hours at 20° C.

13. The non-aqueous photocurable composition of claim 12, wherein the dispersed carbon-coated non-magnetic metal particles are dispersed carbon-coated silver particles or dispersed carbon coated-copper particles, or a mixture of both dispersed carbon-coated silver particles and dispersed carbon-coated copper particles.

14. The non-aqueous photocurable composition of claim 12, wherein the dispersed carbon-coated non-magnetic metal particles are present in an amount of at least 15 weight % and up to and including 60 weight %, based on the total weight of the non-aqueous photocurable composition, and the dispersed carbon-coated non-magnetic metal particles have a median diameter of less than 0.5 μm as determined using a dynamic light scattering method.

15. The non-aqueous photocurable composition of claim 12, further comprising dispersed carbon black in an amount of up to and including 20 weight %, based on the total weight of the non-aqueous photocurable composition.

16. The non-aqueous photocurable composition of claim 12, wherein the particle dispersing agent is an organic polymer that comprises units chosen from at least one of the following classes (i) through (iv):
   (i) pyridine units;
   (ii) imine units;
   (iii) imide units; and
   (iv) amine units.

17. The non-aqueous photocurable composition of claim 12, wherein the organic diluent is an organic solvent medium that comprises at least one of 2-ethoxyethanol, 2-(2-methoxyethoxy)ethanol, 2-(2-ethoxyethoxy)ethanol, 1-methoxy-2-propanol, 4-heptanone, 3-heptanone, 2-heptanone, cyclopentanone, cyclohexanone, diethyl carbonate, 2-ethoxyethyl acetate, N-butyl butyrate, and methyl lactate.

18. The non-aqueous photocurable composition of claim 12, wherein the organic diluent comprises at least one UV-curable component.

19. The non-aqueous photocurable composition of claim 12, wherein the UV-curable component is an acid-catalyzed photocurable component and the non-aqueous photocurable composition further comprises a photoacid generator.

20. The non-aqueous photocurable composition of claim 12, wherein the UV-curable component is a free radically photocurable component, and the non-aqueous photocurable composition further comprises a free radical photoinitiator.

* * * * *